United States Patent [19]

Agostinelli et al.

[11] Patent Number: 5,041,417
[45] Date of Patent: Aug. 20, 1991

[54] CONDUCTIVE ARTICLES AND INTERMEDIATES CONTAINING HEAVY PNICTIDE MIXED ALKALINE EARTH OXIDE LAYERS

[75] Inventors: John A. Agostinelli; Gustavo R. Paz-Pujalt; Arun K. Mehrotra; Liang-sun Hung, all of Rochester, N.Y.

[73] Assignee: Eastman Kodak Company, Rochester, N.Y.

[21] Appl. No.: 325,816

[22] Filed: Mar. 20, 1989

Related U.S. Application Data

[60] Division of Ser. No. 214,976, Jul. 5, 1988, abandoned, which is a continuation-in-part of Ser. No. 172,926, Mar. 25, 1988, abandoned.

[51] Int. Cl.$^5$ .................................................. B32B 9/00
[52] U.S. Cl. .................................... 505/1; 505/701; 505/702; 505/703; 505/704; 428/209; 428/210; 428/426; 428/433; 428/457; 428/688; 428/901; 428/930; 361/397; 361/398
[58] Field of Search ................. 505/1, 701.4; 428/209, 428/210, 426, 433, 457, 688, 901, 930; 174/68.5; 361/397, 398

[56] References Cited

U.S. PATENT DOCUMENTS

| 3,873,341 | 3/1975 | Janus | 427/53.1 |
| 4,292,347 | 9/1981 | Donley | 427/110 |
| 4,316,785 | 2/1982 | Suzuki et al. | 427/63 |
| 4,395,436 | 7/1983 | Bianchi et al. | 427/53.1 |
| 4,485,094 | 11/1984 | Pebler et al. | 427/226 |

OTHER PUBLICATIONS

K. Hoshino, H. Takahara, and M. Fukutomi, "Preparation of Superconducting Bi-Sr-Ca-Cu-O Printed Thick Films on MgO Substrate and Ag Metal Tape", *Japanese Journal of Applied Physics*, vol. 27, No. 7, Jul. 1988, pp. L1297-L1299.

T. Hashimoto, T. Kosaka, Y. Yoshida, K. Fueki, and H. Koinuma, "Superconductivity and Substrate Interaction of Screen-Printed Bi-Sr-Ca-Cu-O Films", *Japanese Journal of Applied Physics*, vol. 27, No. 3, Mar. 1988, pp. L384-L386.

M. Nakao, H. Kuwahara, R. Yuasa, H. Mukaida and A. Mizukami, "Magnetron Sputtering of Bi-Ca-Sr-Cu-O Thin Films with Superconductivity Above 80° K", *Japanese Journal of Applied Physics*, vol. 27, No. 3, Mar. 1988, pp. L378-L380.

T. Nakamori, H. Abe, Y. Takahasi, T. Kanamori, and S. Shibata, "Preparation of Superconducting Bi-Ca-Sr-Cu-O Printed Thick Films Using a Coprecipitation of Oxalates", *Japanese Journal of Applied Physics*, vol. 27, No. 4, Apr. 1988, pp. L649-L651.

J. G. Bednorz and K. A. Müller, "Possible High $T_c$ Superconductivity in the Ba-La-Cu-O System", *Z. Phys. B. —Condensed Matter*, vol. 64, pp. 189-193 (1986).

AS1 C. W. Chu, P. H. Hor, R. L. Meng, L. Gao, Z. J. Huang, and Y. Q. Wang, "Evidence for Superconductivity above 40 K in the La-Ba-Cu-O Compound System", *Physical Review Letters*, vol. 53, No. 4, pp. 405-407, Jan. 1987.

(List continued on next page.)

*Primary Examiner*—Patrick J. Ryan
*Attorney, Agent, or Firm*—Carl O. Thomas

[57] ABSTRACT

Articles are disclosed in which an electrically conductive layer on a substrate exhibits a superconducting transistion temperature in excess of 90°K. Conductive layers are disclosed comprised of a crystalline heavy pnictide mixed alkaline earth copper oxide. Processes of Preparing these articles are disclosed in which a mixed oxide precursor composition is coated and heated to its thermal decomposition temperature to create an amorphous mixed metal oxide layer. The amorphous layer is then heated to its crystallization temperature.

28 Claims, 3 Drawing Sheets

OTHER PUBLICATIONS

C. W. Chu, P. H. Hor, R. L. Meng, L. Gao, and Z. J. Huang, "Superconductivity at 52.5 K in the Lanthanum–Barium–Copper–Oxide System", *Science Reports*, vol. 235, pp. 567–569, Jan. 1987.

R. J. Cava, R. B. VanDover, B. Batlog, and E. A. Rietman, "Bulk Superconductivity at 36 K in $La_{1.8}Sr_{0.2}CuO_4$", *Physical Review Letters*, vol. 58, No. 4, pp. 408–410, Jan. 1987.

J. M. Tarascon, L. H. Greene, W. R. McKinnon, G. W. Hull, and T. H. Geballe, "Superconductivity at 40 K in the Oxygen–Defect Perovskites $La_{2-x}Sr_xCuO_{4-y}$", *Science Reports*, vol. 235, pp. 1373–1376, Mar. 13, 1987.

M K. Wu, J. R. Ashburn, C. J. Torng, P. H. Hor, R. L. Meng, L. Gao, Z. J. Huang, Y. Q. Wang, and C. W. Chu, "Superconductivity at 93 K in a New Mixed–Phase Y–Ba–Cu–O Compound system at Ambient Pressure", *Physical Review Letters*, vol. 58, No. 9, pp. 908–910, Mar. 2, 1987.

Boston Globe on Jan. 28, 1988.

C. E. Rice et al., "Preparation of Superconducting Thin Films of $Ba_2YCU_3O_7$ by a Novel Spin–On Pyrolysis Technique", *Appl. Phys. Lett.*, vol. 51, No. 22, pp. 1842–1844 (1987).

A. H. Hamdi et al., "Formation of Thin–Film High $T_c$ Superconductors by Metaloorganic Deposition", *Appl. Phys. Lett.*, vol. 51, No. 25, pp. 2152–2154 (1987).

M. E. Gross et al., "Versatile New Metaloorganic Process for Preparing Superconducting Thin Films", *Appl. Phys. Lett.*, vol. 52, No. 2, pp. 160–162 (1988).

T. Kumagai et al., "Preparation of Superconducting $YBa_2Cu_3O_{7-d}$ Thin Films by the Dipping–Pyrolysis Process Using Organic Acid Salts", *Chemistry Letters*, pp. 1645–1646 (1987).

H. Nasu et al., "Superconducting Y–Ba–Cu–O Films with $T_c > 70$ K Prepared by Thermal Decomposition Technique of Y–, Ba–, and Cu–2–ethylhexanoates", *Chemistry Letters*, pp. 2403–2404 (1987).

H. Maeda, Y. Tanaka, M. Fukutom, and Y. Asano, "A New High $T_c$ Superconductor Without a Rare Earth Element", *Japanese Journal of Applied Physics*, vol. 27, No. 2, pp. L209–L210.

Davison et al., "High Tc Superconducting Films From Mettalo–Organic Precursors", MRS vol. 99, No. 1987, —.289–292.

Gupta et al., "Direct Laser Writing of Superconducting Patterns of $Y_1Ba_2Cu_3O_{7-\delta}$", Appl. Phys. Lett. 52(8) Feb. 1988, pp. 665–666.

Gupta et al., "Laser Writing of Copper Lines from Metaloorganic Films", Appl. Phys. Lett. 51(26) Dec. 1987, pp. 2254–2256; and Gross et al., "Laser Direct–Write Metallization in Thin Palladium Acetate Films", J. Appl. Phys. 61(4) Feb. 1987, pp. 1628–1632.

Superconductivity in Pseudo–Quaternary System, Yao et al., Metls Res. Soc. Symp. Proc., vol. 99, pp. 543–547, 12–87.

Studies of the Superconducting Oxides $Nd_x Y_{1a} Ba, Cu_3O_y$, D. Angelis et al., Solid State Comms., vol. 64, No. 11, pp. 1353–1357, 1987.

X–Ray Absorption Studies of $La_{2-x}Sr_xCuO_4$ and $Y_{l-x}Pr_xBo_2Cu_3O_{7-\delta}$, Alg et al., Met. Res. Jor. Symp. Proc., vol. 99, pp. 177–182, 12–87.

Magnetic Susceptibility of Fo dope J Y $Ba_2Cu_3O_{7-\delta}$, Noguchi et al., Jap. Journ. Appl. Phys., vol. 27, No. 3, pp. L390–392, Mar. 1988.

Crystal Structure of Y $Ba_2Cu_{3-\delta}Ad\ O_{9-\delta}$ (A=Ni, 2n and Co), Kajitani et al., Jap. Journ. Appl. Phys., vol. 27, No. 3, Mar. 1988, pp. L354–L357.

Preparation and Physical Properties of $PrBa_2Cu_3Oyx$, OKai et al., Jap. Journ. Appl. Phys., vol. 26, No. 10, Oct., 1987, pp. L1648–L1650.

CONDUCTIVE ARTICLES AND INTERMEDIATES CONTAINING HEAVY PNICTIDE MIXED ALKALINE EARTH OXIDE LAYERS

This is a division of application Ser. No. 214,976, filed July 5, 1988, now abandoned, which was a continuation-in-part of U.S. Ser. No. 172,926, filed Mar. 25, 1988, now abandoned.

FIELD OF THE INVENTION

The present invention relates to articles having conductive coatings, to processes for preparing these articles, and to useful intermediate articles. In certain preferred forms this invention relates to articles having superconductive coatings and processes for their preparation.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials. The highest temperature at which superconductivity (i.e., zero resistance) can be measured in a material is referred to as $T_o$.

It has been recently recognized that certain rare earth alkaline earth copper oxides exhibit superconducting transition temperatures well in excess of the highest previously known metal oxide $T_c$, a 13.7° K. $T_c$ reported for lithium titanium oxide. Some heavy pnictide mixed alkaline earth copper oxides also exhibit superconducting transition temperatures well in excess of the highest previously accepted reproducible $T_c$, 23.3° K. for the metal $Nb_3Ge$.

Recent discoveries of higher superconducting transition temperatures in rare earth alkaline earth copper oxides are reported in the following publications:

P-1 J. G. Bednorz and K. A. Müller, "Possible High $T_c$ Superconductivity in the Ba-La-Cu-O System", Z. Phys. B. - Condensed Matter, Vol. 64, pp. 189–193 (1986) revealed that polycrystalline compositions of the formula $Ba_xLa_{5-x}Cu_5O_{5(3-y)}$, where x=1 and 0.75 and y>0 exhibited superconducting transition temperatures in the 30° K. range.

P-2 C. W. Chu, P. H. Hor, R. L. Meng, L. Gao, Z. J. Huang, and Y. Q. Wang, "Evidence for Superconductivity above 40° K. in the La-Ba-Cu-O Compound System", Physical Review Letters, Vol. 53, No. 4, pp. 405–407, Jan. 1987, reported increasing $T_c$ to 40.2° K. at a pressure of 13 kbar. At the end of this article it is stated that M. K. Wu increased $T_c$ to 42° K. at ambient pressure by replacing Ba with Sr.

P-3 C. W. Chu, P. H. Hor. R. L. Meng, L. Gao, and Z. J. Huang, "Superconductivity at 52.5 K in the Lanthanum-Barium-Copper-Oxide System", Science Reports, Vol. 235, pp. 567–569, Jan. 1987, a $T_c$ of 52.5° K. for $(La_{0.9}Ba_{0.1})_2CuO_{4-y}$ at high pressures.

P-4 R. J. Cava, R. B. vanDover, B. Batlog, and E. A. Rietman, "Bulk Superconductivity at 36 K in $La_{1.8}Sr_{0.2}CuO_4$", Physical Review Letters, Vol. 58, No. 4, pp. 408–410, Jan. 1987, reported resistivity and magnetic susceptibility measurements in $La_{2-x}Sr_xCuO_4$, with a $T_c$ at 36.2° K. when x=0.2.

P-5 J. M. Tarascon, L. H. Greene, W. R. McKinnon, G. W. Hull, and T. H. Geballe, "Superconductivity at 40 K in the Oxygen-Defect Perovskites $La_{2-x}Sr_xCuO_{4-y}$", Science Reports, Vol. 235, pp. 1373–1376, Mar. 13, 1987, reported title compounds (0.05<x<1.1) with a maximum $T_c$ of 39.3° K.

P-6 M. K. Wu, J. R. Ashburn, C. J. Torng, P. H. Hor, R. L. Meng, L. Gao, Z. J. Huang, Y. Q. Wang, and C. W. Chu, "Superconductivity at 93 K in a New Mixed-Phase Y-Ba-Cu-O Compound System at Ambient Pressure", Physical Review Letters, Vol 58, No. 9, pp. 908–910, Mar. 2, 1987, reported stable and reproducible superconducting transition temperatures between 80° and 93° K. at ambient pressures for materials generically represented by the formula $(L_{1-x}M_x)_aA_bD_y$, where L=Y, M=Ba, A=Cu, D=0, x=0.4, a=2, b=1, and y<4.

The experimental details provided in publications P-1 through P-6 indicate that the rare earth alkaline earth copper oxides prepared and investigated were in the form of cylindrical pellets produced by forming a mixed oxide by firing, grinding or otherwise pulverizing the mixed oxide, compressing the particulate mixed oxide formed into cylindrical pellets, and then sintering to produce a polycrystalline pellet. While cylindrical pellets are convenient articles for cooling and applying resistance measuring electrodes, both the pellets and their preparation procedure offer significant disadvantages to producing useful electrically conductive articles, particularly articles which exhibit high conductivity below ambient temperature—e.g., superconducting articles. First, the step of grinding or pulverizing the amorphous oxide on a commercial scale prior to sintering is both time and energy consuming and inherently susceptible to material degradation due to physical stress on the material itself, erosion of grinding machinery metal, and handling. Second, electrically conductive articles rarely take the form of pellets. Electrically conductive articles most commonly take the form of flexible elongated conductive articles—e.g., wires, and articles forming conductive pathways on a substrate, such as insulative and semiconductive substrates—e.g., printed and integrated circuits.

H. Maeda, Y. Tanaka, M. Fukutom, and Y. Asano, "A New High $T_c$ Superconductor Without a Rare Earth Element", Japanese Journal of Applied Physics, Vol. 27, No. 2, pp. L209 and L210, discloses that at least one compound of bismuth, strontium, calcium, copper, and oxygen has been found to be superconducting. More detailed publications in the technical literature on this subject have occurred subsequent to the effective filing date of this patent application.

RELATED COMMONLY ASSIGNED CO-PENDING APPLICATIONS

Mir et al U.S. Ser. No. 46,593, filed May 4, 1987, titled CONDUCTIVE ARTICLES AND PROCESSES FOR THEIR PREPARATION now U.S. Pat. No. 4,880,770, discloses articles containing an electrically conductive rare earth alkaline earth copper oxide layer and processes for their preparation.

Strom et al U.S. Ser. No. 68,391, filed July 1, 1987, titled CONDUCTIVE THICK FILMS AND PROCESSES FOR FILM PREPARATION now allowed, now U.S. Pat. No. 4,908,346 discloses articles, now abandoned in favor of U.S. Ser. No. 330,409, filed Mar. 30, 1989, containing an electrically conductive rare earth alkaline earth copper oxide layer having at thickness of at least 5 $\mu$m and processes for their preparation.

Agostinelli et al U.S. Ser. No. 85,047, filed Aug. 13, 1987, titled BARRIER LAYER CONTAINING CONDUCTIVE ARTICLES, now abandoned in favor of U.S. Ser. No. 330,409, filed Mar. 30, 1989, now allowed, discloses articles as described above including a barrier layer interposed between the substrate and conductive layer containing a metal in its elemental form or in the form of an oxide or silicide chosen from the group consisting of magnesium, a group 4 metal, or a platinum group metal.

Hung et al U.S. Ser. No. 153,699, filed Feb. 8, 1988, titled BARRIER LAYER ARRANGEMENT FOR CONDUCTIVE LAYERS ON SILICON SUBSTRATES discloses, now U.S. Pat. No. 4,908,348, articles having a silicon substrate and a conductive layer as described above additionally including a barrier layer triad consisting of silica as a first layer, a group 4 heavy metal oxide as a third layer, and a second layer interposed between the first and third layers of mixed composition.

Lelental et al, U.S. Ser. No. 208,707 filed June 20, 1988 titled IMPROVED HIGH $T_c$ SUPERCONDUCTING Y-Ba-Cu-O THIN FILMS, discloses articles containing an electrically conductive rare earth alkaline earth copper oxide film having a molecular ration $Y_1$:-$Ba_2$:$Cu_3$ formed over a crystalline $Y_2$:$Ba_1$:$Cu_1$ and processes for making such articles.

Agostinelli et al, U.S. Ser. No. 208,706 filed June 20, 1988 titled CONDUCTIVE ARTICLES AND PROCESSES FOR THEIR PREPARATION, now U.S. Pat. No. 4,956,335, discloses articles containing conductive rare earth alkaline earth cuprates and heavy pnictide mixed alkaline earth cuprate films having a chemical etch release layer, e.g., CuO interposed between the substrate and the conductive film precursor to improve patterning of the films.

SUMMARY OF THE INVENTION

In one aspect this invention is directed to an article comprised of a substrate and an electrically conductive layer located on the substrate characterized in that the electrically conductive layer is comprised of a crystalline heavy pnictide mixed alkaline earth copper oxide wherein the heavy pnictide is bismuth and optionally containing antimony in a concentration of less than 10 mole percent based upon the bismuth content.

In another aspect this invention is directed to an article comprised of a substrate and a layer of an amorphous metal oxide located on the substrate characterized in that the amorphous metal oxide is a heavy pnictide mixed alkaline earth copper oxide wherein the heavy pnictide is bismuth and optionally containing antimony in a concentration of less than 10 mole percent based upon the bismuth content.

In an additional aspect this invention is directed to a process comprising applying to a substrate metal oxide precursors and thermally decomposing the precursors. The process is characterized in that onto the substrate is coated a solution consisting essentially of a volatilizable film forming solvent and metal-ligand compounds of each of heavy pnictide, at least two different alkaline earth metals, and copper containing at least one thermally decomposable ligand and the solvent and ligands are removed from the substrate, this step including heating in the presence of oxygen to form an amorphous heavy pnictide mixed alkaline earth copper oxide coating on the substrate wherein the heavy pnictide is bismuth and optionally antimony in a concentration of less than 10 mole percent based upon the bismuth content.

In a further aspect this invention is directed to a process as recited above further characterized in that the amorphous heavy pnictide mixed alkaline earth copper oxide is converted to a crystalline coating by heating the amorphous coating to a temperature at which heavy pnictide mixed alkaline earth copper oxide crystals are formed.

In a more specific aspect this invention is directed to a process of forming a pattern of crystalline heavy pnictide mixed alkaline earth copper oxide on a substrate wherein the heavy pnictide is bismuth and optionally antimony in a concentration of less than 10 mole percent based upon the bismuth content. The process comprises (a) coating onto the substrate a solution consisting essentially of a volatilizable film forming solvent and metal-ligand compounds of each of heavy pnictide, at least two alkaline earth metals, and copper containing at least one thermally decomposable ligand, (b) removing the solvent and ligands from the substrate, this step including heating in the presence of oxygen to form an amorphous heavy pnictide mixed alkaline earth copper oxide coating on the substrate, (c) forming a photoresist pattern on the amorphous coating, (d) removing the amorphous coating not protected by the photoresist pattern, (e) removing the photoresist pattern, and (f) converting the amorphous heavy pnictide mixed alkaline earth copper oxide remaining on the substrate to a crystalline coating by heating the amorphous coating to a temperature at which crystallization of the heavy pnictide mixed alkaline earth copper oxide occurs.

In another specific aspect this invention is directed to a process of producing a flexible elongated electrical conductor comprising transporting a flexible elongated substrate through a coating zone where it is coated with a precursor of an electrical conductor and transporting the substrate from the coating zone into a heating zone to convert the precursor to an electrically conductive form. The process is characterized in that (a) in the coating zone the substrate is brought into contact with a solution consisting essentially of a volatilizable film forming solvent and metal-ligand compounds of each of heavy pnictide, at least two alkaline earth metals, and copper containing at least one thermally decomposable ligand, (b) in a first region of the heating zone the solvent and ligands are removed from the substrate, this step including heating in the presence of oxygen to form an amorphous heavy pnictide mixed alkaline earth copper oxide coating on the substrate, and (c) in a second region of the heating zone the amorphous heavy pnictide mixed alkaline earth copper oxide is converted to an electrically conductive form by heating the amorphous oxide to a temperature at which crystallization of the heavy pnictide mixed alkaline earth copper oxide occurs. In still a further aspect this invention is directed to an article comprised of a substrate having a barrier layer structure on the substrate and an electrically conductive layer located on the barrier layer characterized in that
 (a) the electrically conductive layer is comprised of a crystalline heavy pnictide mixed alkaline earth copper oxide compound wherein the heavy pnictide is bismuth and optionally antimony in a concentration of less than 10 mole percent with respect to the bismuth;
 (b) the substrate is one which under the temperatures employed for forming the crystalline layer causes degradation of the conductive electrical properties of the layer; and
 (c) the barrier layer structure includes a film comprising $ZrO_2$.

In another aspect, the invention is directed to an intermediate article comprising the aforesaid substrate and barrier layer structure thereon and further comprising a layer of a mixture of bismuth oxide, alkaline earth oxides or carbonates and copper oxide which when appropriately heated by subsequent fabricators forms the desired conductive crystalline compound layer.

In a more particular aspect, the invention is directed to an article including a barrier layer structure primarily directed to protecting a silicon substrate and a heavy pnictide mixed alkaline earth copper oxide conductive layer coated thereon from mutual contamination. Specifically, the barrier layer structure which is interposed between the conductive layer and the silicon substrate comprises a barrier layer triad comprising a first triad layer located adjacent the silicon substrate consisting essentially of silica, a third triad remote from the silicon substrate consisting essentially of at least one Group 4 heavy metal oxide, and a second triad layer interposed between the first and third triad layers consisting essentially of a mixture of silica and at least one Group 4 heavy metal oxide as well as any reaction product of the mixture.

The present invention makes available to the art for the first time articles containing an electrically conductive heavy pnictide mixed alkaline earth copper oxide layer having a superconducting transition temperature in excess of 90° K. and exhibiting superconductivity at temperatures ranging above the boiling temperature of liquid nitrogen, 77° K. Further, these articles are capable of being fabricated in any of the most commonly employed geometrical forms of electrically conductive elements. This invention makes possible electrically conductive elongated articles, such as elongated flexible articles employed for the fabrication of leads and windings in electrical circuits as well as electrically conductive articles exhibiting circuit patterns—e.g., printed, hybrid, and integrated circuits. The present invention also makes available to the art unique thin film elements.

Additionally the present invention makes available to the art intermediate articles which can be further fabricated by subsequent fabricators to satisfy specific circuit applications. That is, the present invention makes available intermediate articles which can be processed further to produce desired circuitry.

The articles of this invention can be fabricated by techniques that avoid the disadvantages of the prior art. No grinding or pulverizing steps are required. In addition, the fabrication processes of this invention lend themselves to fabrication of articles of the most commonly employed electrical conductor geometrical forms. Specific processes of the invention allow conductive layer patterning. Further, conductive layers and pathways can be formed in the articles of the invention with minimal heating of the substrate.

Significantly, the heavy pnictide mixed alkaline earth copper oxide coatings produced by the present invention offer significant advantages in their processes of preparation over those of high transition temperature rare earth alkaline earth copper oxide materials. The heavy pnictide mixed alkaline earth copper oxide coatings allow for greater latitude in processing. They crystallize at lower temperatures. Their properties appear less affected by ambient oxygen conditions during heating and cooling, and they exhibit high transition temperatures and high superconductivity temperatures which appear relatively independent of their rate of cooling following crystallization.

BRIEF DESCRIPTION OF THE DRAWINGS

These and other advantages of the invention can be better appreciated by reference to the following detailed description of preferred embodiments considered in conjunction with the drawings, in which.

DESCRIPTION OF PREFERRED EMBODIMENTS

The present invention has as its purpose to make available electrically conductive articles exhibiting a heavy pnictide mixed alkaline earth copper oxide conductive layer coated on a substrate. The term "heavy pnictide mixed alkaline earth copper oxide" refers to a composition of matter containing at least one heavy pnictide element, at least two alkaline earth elements, copper, and oxygen. The term "heavy pnictide" is employed to designate Group 15 elements having an atomic number of at least 51—i.e., bismuth and antimony. Generally, the heavy pnictide element is bismuth, optionally with less than 10 mole percent of antimony with respect to bismuth. The term "alkaline earth" indicates elements of Group 2. Calcium, strontium and barium are preferred alkaline earth elements for the practice of this invention. References to Groups 2 and 15 are based on the periodic Table of elements as adopted by the American Chemical Society.

In keeping with the established practice in the ceramics art of shortening lengthy chemical names of mixed metal oxides by substituting acronyms based on the first letters of the metals present, the term "PAC" is hereinafter employed to indicate generically heavy pnictide mixed alkaline earth copper oxides. When it is intended to designate specifically the heavy pnictide or alkaline earth component specifically, the chemical symbol or symbols are substituted for P and/or A. The term "RAC" is employed to indicate rare earth alkaline earth copper oxide layers.

Except as otherwise noted, all steps in the preparation of electrically conductive articles according to this invention are understood to be practicable in air at atmospheric pressure. It is, of course, recognized that increasing the proportion of ambient oxygen present and operation at elevated pressures, used separately or together, is generally compatible with the practice of this invention and can be employed, although not required. As compared to rare earth alkaline earth copper oxides the heavy pnictide mixed alkaline earth copper oxides appear to be relatively insensitive to variations in ambient oxygen levels.

Figure 1:
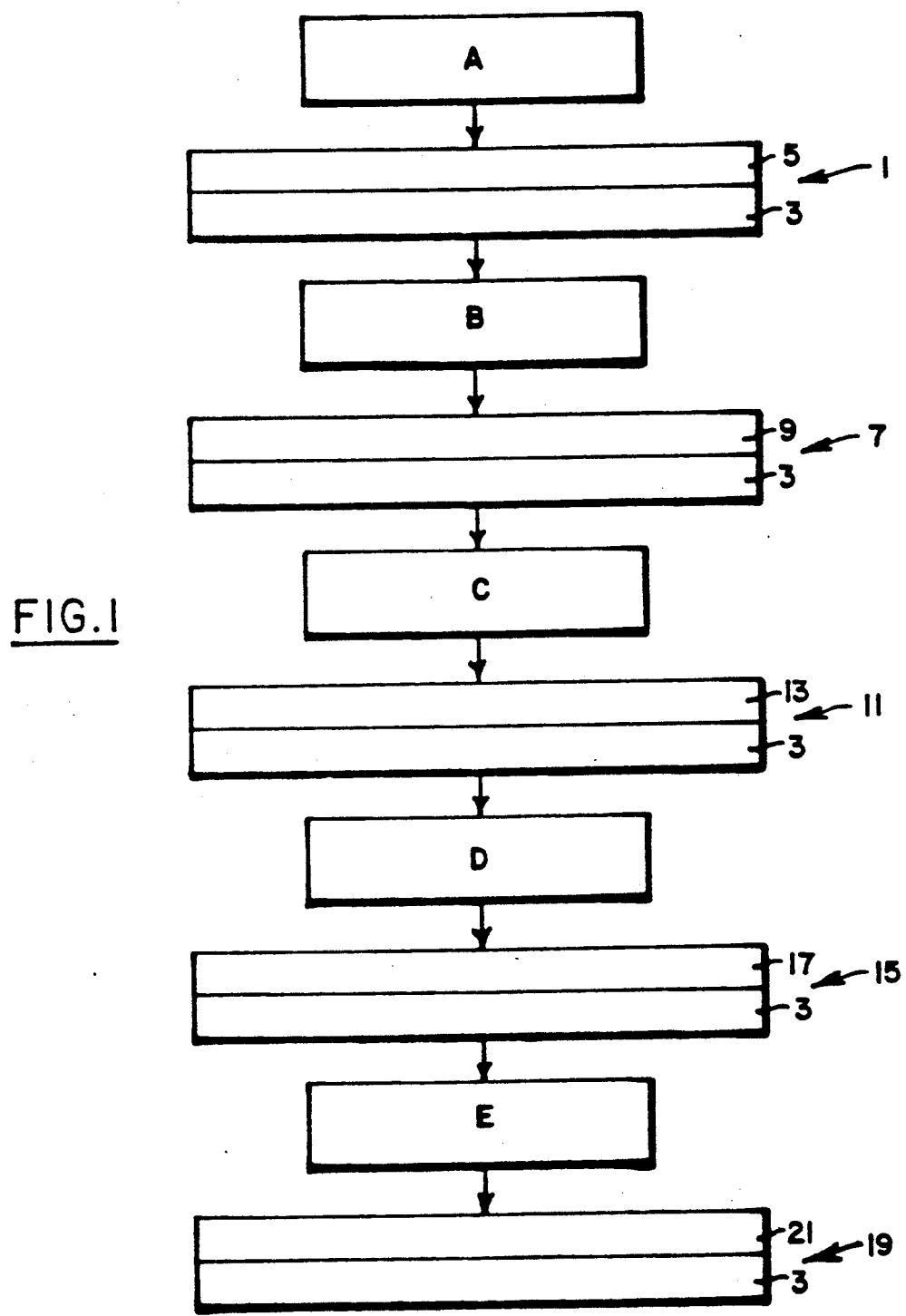
FIG. 1 is schematic diagram showing process steps and articles produced thereby.

The present invention can be appreciated by the schematic diagram shown in FIG. 1. In Step A of the preparation process, onto a substrate is coated a solution consisting essentially of a volatilizable film forming solvent and metal-ligand compounds of each of heavy pnictide, at least two different alkaline earth elements, and copper containing at least one thermally volatilizable ligand. A thermally volatilizable metal-ligand layer generally refers to a metal-ligand layer which decomposes upon heating to gaseous products and a film of the metal; metal oxide or metal carbonate. The resulting coated article 1 as schematically shown consists of substrate 3 and a layer 5 formed by PAC precursors (metal-ligand compounds) and film forming solvent.

In Step B article 1 is heated to a temperature sufficient to volatilize the ligands and the film forming solvent. The element 7 resulting consists of substrate 3 and amorphous PAC layer 9. In its amorphous form the PAC coating exhibits relatively low levels of electrical conductivity. It should be understood that the term "amorphous" layer as used herein does not exclude a portion of the components making up the layer from exhibiting some crystallinity as observed by X-ray diffraction and represents a mixture of oxides of the various metals comprising the layer. Further, in some instances one or more metals, particularly the alkaline earths, may be present as a carbonate. However, for purposes of this description such carbonates shall be broadly included in the term "oxide" when referring to the mixture of oxides or amorphous PAC layer. It is known to those skilled in the art that such carbonates are decomposable to the metal oxide upon further heating as takes place in Step C.

To convert the amorphous PAC layer to a more highly conductive form it is necessary to induce crystallization of the PAC layer. In Step C the article 7 is heated to a temperature sufficient to convert the amorphous PAC layer to a more electrically conductive crystalline form. In article 11 the PAC layer 13 on substrate 3 is crystalline.

Crystallization of the PAC layer occurs in two stages—crystal nucleation and crystal growth. It is in some instances preferred to achieve crystal nucleation at a somewhat different temperature than is employed for crystal growth. Microscopic examination of articles at an early stage of crystallization reveals crystal nuclei surrounded by at least one other PAC phase. Further heating of the PAC layer at the temperature of nucleation or, preferably, at a somewhat higher temperature increases the size of the crystal nuclei at the expense of the surrounding PAC phase or phases until facets of adjacent crystals are grown into electrically conductive juxtaposition. The term crystallization also includes compound formation of the conductive PAC layer compound from the amorphous PAC layer mixture of oxides as well as the nucleation and crystal growth mentioned above.

According to accepted percolation theory, for a layer consisting of conducting spheres located in a surrounding nonconducting medium the spheres must account for at least 45 percent by volume of the layer for satisfactory electrical conductivity to be realized. If conducting particles of other geometric forms, particularly elongated forms, are substituted for the spheres, the conducting particles can account for less of the layer volume while still realizing satisfactory layer electrical conductivity. Similarly, electrical conductivity can be realized with a lesser proportion of conducting particles when the surrounding medium is also conductive. In the present invention the PAC layers the geometrical form of the conductive crystals is such that electrical conductivity is realized when these crystals form substantially less than 45 percent by volume of the layer. Satisfactory electrical conductivity is observed when the conductive crystalline phase forms only 30 percent or less by volume of the layer. However, it is generally preferred that the conductive crystalline phase form at least 70 percent, optimally at least 90 percent, by volume of the total PAC layer.

To achieve crystallization the PAC layer can be heated to any convenient temperature level. In general satisfactory crystallization of the PAC layer can be achieved at lower temperatures than have been suggested for the crystallization of RAC layers. Crystallization is contemplated at temperatures below those which result in volatilization of heavy pnictide oxide. To avoid interaction with less than inert substrates, it is generally preferred that heating of the PAC layer be heated no higher than is required for satisfactory crystallization. Heating to achieve crystallization can, for example, be limited to temperatures below the melting point of the PAC composition forming the layer. From microscopic examination of PAC layers optimum heating times can be selected for maximizing both the proportion of the PAC layer accounted for by the crystalline phase and the desired configuration of the crystals produced, thereby maximizing electrical conductivity.

Step D entails cooling of the PAC layer from its crystallization temperature. It is a surprising observation that PAC layer conductivities, unlike RAC layer conductivities, have been observed to be relatively independent of their cooling rates. Therefore, no particular cooling profile need be imposed on the PAC layer. In one form rapid cooling rates—e.g., direct removal from the furnace temperature to ambient room temperature is preferred. However, in processing conductive RAC films, a cooling rate of 25° C. per minute or less is contemplated until the crystalline PAC layer reaches a temperature of at least 500° C. or, preferably, 200° C. Below these temperatures the lattice is sufficiently rigid that the desired crystal structure is well established. The article 15 produced is formed of the annealed crystalline PAC layer 17 on substrate 3.

The article 15 exhibits high levels of electrical conductivity and appears to exhibit little sensitivity to oxygen levels present during crystallization and cooling. Therefore, unlike the preparation of RAC layers, a post-crystallization oxygen treatment step is not required to achieve high levels of electrical conductivity.

The present invention does not, however, preclude such an additional processing step, if desired. For example, an article containing both a RAC layer and a PAC layer would normally be given a post crystallization oxygen treatment to improve the conductivity of the RAC layer. Therefore, optional Step E, developed originally for RAC layers, entails heating the article 15 in an oxygen enriched atmosphere, preferably pure oxygen. The object is to equilibrate the crystalline layer with the oxygen enriched atmosphere, thereby incorporate sufficient oxygen into the crystal lattice structure. Temperatures for oxygen enrichment of the RAC layer are above the minimum annealing temperatures employed in Step D described above. The duration and temperature of heating are interrelated, with higher temperatures allowing shorter oxygen enrichment times to be employed. Substantially complete oxygen equilibration of the RAC layer can be realized at near minimum temperatures in about 1 hour. Generally any oxygen enrichment of the RAC layer will result in adequate incorporation in the PAC layer, since the properties of the latter remain surprisingly invariant with alterations in oxygen availability.

In preparing layers shown to be benefitted by oxygen enrichment of the ambient atmosphere Step E can be consolidated with either or both of Steps C and D. Oxygen enrichment is particularly compatible with Step D, allowing annealing out of crystal lattice defects and correction of crystal lattice oxygen deficiencies to proceed concurrently.

The final electrically conductive article 19 is comprised of a crystalline, electrically conductive PAC layer 21 on substrate 3. Depending upon specific choices of materials and preparation techniques, the article 19 can exhibit a high superconducting transition temperature, herein employed to designate a $T_c$ of greater than 100° K.

The process described for preparing electrically conductive articles having PAC layers offers several distinct advantages. One of the most significant advantages is that the proportions of heavy pnictide, alkaline earth, and copper elements in the final PAC layer 21 exactly correspond to those present in the PAC precursor layer 5. In other words, the final proportion of heavy pnictide, alkaline earth, and copper elements is determined merely by mixing in the desired proportions in the film forming solvent the metal-ligand compounds employed as starting materials. This avoids what can be tedious and extended trial and error adjustments of proportions required by commonly employed metal oxide deposition techniques, such as sputtering and vacuum vapor deposition. Further, the present process does not require any reduction of atmospheric pressures, and thus no equipment for producing either high or low vacuum.

A further significant advantage of the process of this invention is that it can be applied to the fabrication of electrically conductive articles of varied geometry, particularly those geometrical forms of electrical conductors most commonly employed.

The present invention lends itself readily to the preparation of elongated electrically conductive articles, particularly flexible elongated electrically conductive articles, such as those employed as electrical leads, conductive windings in electro-magnets, conductive armature and/or field windings in electrical motors and generators, conductive windings in transformers, conductive windings in solenoids, and as long distance electrical transmission lines. Contemplated flexible elongated electrically conductive articles include those referred to in the art as rods, wires, fibers, filaments, threads, strands, and the like. In addition conductive cladding of ribbons, sheets, foils, and films is contemplated.

A coating process particularly adapted to coating flexible substrates can be illustrated by reference to FIG. 2, wherein an elongated flexible substrate 25 is unwound from a supply spool 27 and passed downwardly over a guide roller 29 into a reservoir 31. The reservoir contains a film forming solvent with metal-ligand compounds dissolved therein, as described above in connection with Step A, shown as a liquid body 33. The flexible substrate is drawn over a lower guide roller 35 while immersed in the liquid and then passed upwardly to a third guide roller 37.

As the flexible substrate is drawn upwardly it emerges from the liquid body bearing an annular thin, uniform surface layer corresponding to layer 5 in FIG. 1. Between the reservoir and the third guide roller the coated substrate is drawn through a heating zone to complete in different regions of the heating zone process Steps B, C, D, and E sequentially, as previously described. To accommodate needs for different residence times within the various heating regions the lengths of the different regions can be adjusted. Additionally, residence time of a substrate within any heating region can be further increased by employing laterally diverting guides, so one or a number of coated substrate festoon-like path diversions are created within the heating region.

After passing over the third guide roller the substrate, bearing an annular crystalline electrically conductive PAC layer is wound onto a storage spool 39. Where the PAC layer is coated on a flexible substrate, it is preferred to maintain the thickness of the PAC layer at 2 $\mu$m or less, preferably 1.0 $\mu$m or less, so that it exhibits adequate flexibility. Flexing of the PAC layer required by guiding and spooling by can be reduced by increasing the radius of curvature imposed by the third guide roller and storage spool.

Figure 2:
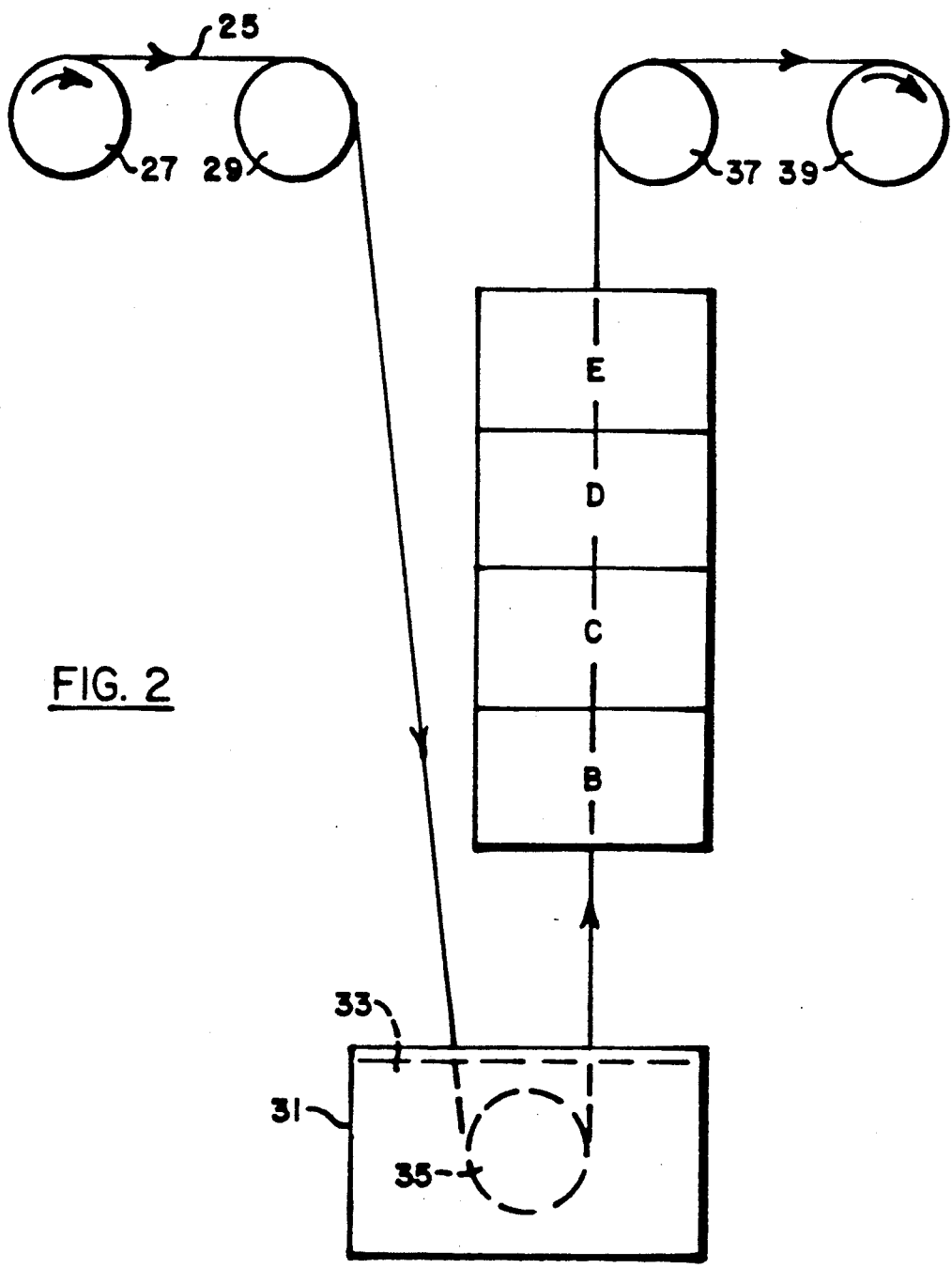
FIG. 2 is a schematic diagram of an arrangement for coating a elongated flexible substrate.

The arrangement shown in FIG. 2 for applying a flexible PAC layer to a flexible substrate is, of course, merely illustrative of a number of approaches which can be employed to apply a PAC layer to a flexible substrate. Where it is more convenient to perform process steps B, C, D, and E in a horizontally offset rather than vertically offset spatial relationship, instead of applying the PAC precursors and film forming solvent by immersion of the substrate, other conventional coating approaches can be employed for application, such as roll coating, spraying, brushing, curtain coating, extrusion, or the like. It is generally preferred to avoid guide contact of the coated substrate between application of the PAC precursors and completion of Step B. However, once a solid PAC layer exists on the substrate, guide contact with the substrate within or between any one of process Step C, D, and E locations can be undertaken, as desired for convenient spatial orientation.

While flexible electrical conductors of extended length serve a variety of important applications, there are many other applications for electrical conductors, particularly those located on limited portions of substantially planar surfaces of substrates. Such applications include those served by conventional printed, integrated, and hybrid circuits. In such circuits limited, if any, flexibility of the electrical conductor is required, but an ability to define areally—i.e, pattern, the electrical conductor with a high degree of precision is in many instances of the utmost importance. The present invention is compatible with precise patterning of the electrical conductor on a substrate surface.

Figure 3:
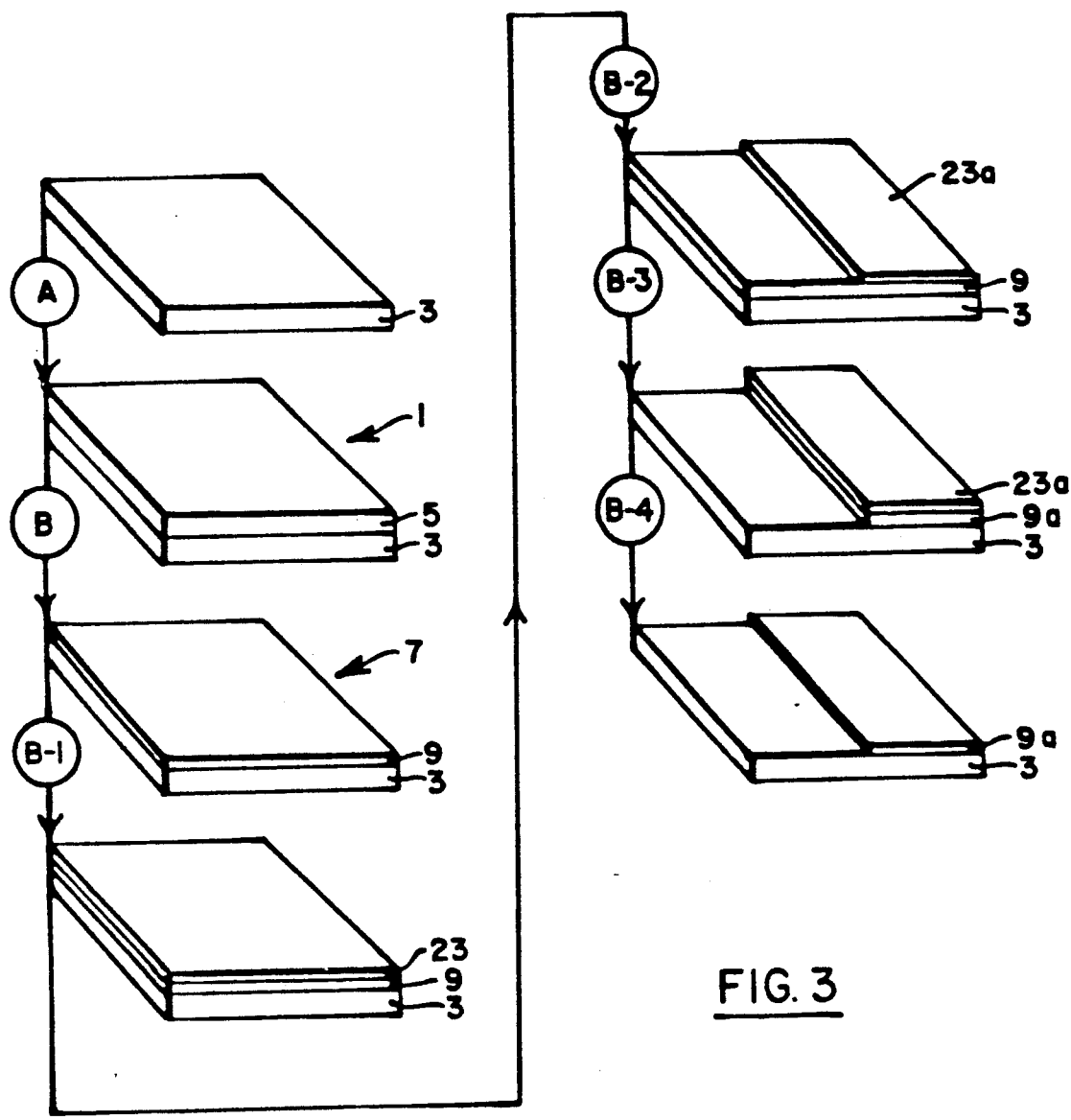

Patterning of an electrical conductor according to this invention is illustrated by reference to FIG. 3. Substrate 3 is coated on its upper planar surface with a uniform PAC precursor layer 5 as described above in connection with process Step A to form initial coated article 1. Process Step B, described above, is performed on article 1 to produce article 7, described above, comprised of amorphous PAC layer 9 and substrate 3.

The amorphous PAC layer lends itself to precise pattern definition and produces results generally superior to those achieved by patterning the PAC precursor layer from which it is formed or the crystalline PAC layer which is produced by further processing. The PAC precursor layer is often liquid before performing process Step B and is in all instances softer and more easily damaged in handling than the amorphous PAC layer. The crystalline PAC layer cannot be etched with the same boundary precision as the amorphous PAC layer, since etch rates vary from point to point based on local variations in the crystal faces and boundaries presented to the etchant. Patterning of either the PAC precursor layer or the crystalline PAC layer is specifically recognized as a viable alternative to patterning the amorphous PAC layer for applications permitting more tolerance of conductor dimensions. For example, screen printing the PAC precursor layer on a substrate to form a printed circuit is specifically contemplated.

While the amorphous PAC layer can be patterned employing any conventional approach for patterning metal oxides, for more precise edge definitions the preferred approach is to photopattern the amorphous PAC layer employing any of the photoresist compositions conventionally employed for the precise definition of printed circuit or integrated circuit conductive layers. In a preferred form of the process, a uniform photoresist layer 23 is applied to the amorphous PAC layer 9 as indicated by Process Step B-1. The photoresist layer can be formed by applying a liquid photoresist composition to the substrate, spinning the substrate to insure uniformity of the coating, and drying the photoresist. Another approach is to laminate a preformed photoresist layer supported on a transparent film to the amorphous PAC layer.

The photoresist layer is then imagewise exposed to radiation, usually through a mask. The photoresist can then be removed selectively as a function of exposure by development. Positive working photoresists are removed on development from areas which are exposed to imaging radiation while negative working photoresists are removed only in areas which are not exposed to imaging radiation. Exposure and development are indicated by process Step B-2. Following this step patterned photoresist layer 23a is left on a portion or portions of the amorphous PAC layer 9. Although the patterned residual photoresist layer is for convenience shown of a simple geometrical form, it is appreciated that in practice the patterned photoresist can take any of a wide variety of geometrical forms, including intricate and thin line width patterns, with line widths ranging into the micrometer range.

Following patterning of the photoresist layer, portions of the PAC layer which are not protected by the photoresist can be selectively removed, such as by chemical etching or ion beam milling, as indicated by process Step B-3. This converts the amorphous PAC layer 9 to a patterned PAC layer 9a confined to areas corresponding to that of the photoresist.

Following patterning of the amorphous PAC layer the patterned photoresist is removed, as indicated by process Step B-4. The final article as shown in FIG: 3 consisting of the substrate 3 and patterned amorphous PAC layer 9a is then further processed as indicated in FIG. 1, picking up with process Step C. The crystalline PAC layer formed in the final product conforms to the patterned amorphous PAC layer.

In the process of preparing a patterned article described above it is noted that once an article is formed having an amorphous PAC layer on a substrate it can be patterned to serve any of a wide variety of circuit applications, depending upon the circuit pattern chosen. It is therefore recognized that instead of or as an alternative to offering patterned or unpatterned crystalline PAC layer articles for sale a manufacturer can instead elect to sell articles with unpatterned amorphous PAC layers, with or without an unpatterned photoresist layer, to subsequent fabricators. It will often be convenient in this instance to locate a removable layer or film over the amorphous PAC layer for its protection prior to further fabrication. The subsequent fabricator can undertake the patterned exposure and further processing required to produce a finished electrically conductive article.

To crystallize a PAC layer the substrate and PAC layer are heated uniformly. This step will in most instances itself provide all of the annealing and oxygen enrichment required by the PAC layer. Heating can be accomplished employing any conventional oven. In some instances, however, either to protect the substrate from rising to the peak temperatures encountered by the PAC layer or simply to avoid the investment in an oven by fabricator, it is contemplated that the PAC layer will be selectively heated. This can be accomplished by employing a radiant heat source, such as a lamp—e.g., a quartz lamp. Lamps of this type are commercially available for achieving rapid thermal annealing of various conventional layers and can be readily applied to the practice of the invention. These lamps rapidly transmit high levels of electromagnetic energy to the PAC layer, allowing it to be brought to its crystallization temperature without placing the substrate in an oven.

A diverse approach for producing patterned electrical conductors can be practiced by employing article 7 comprised of the uniform amorphous PAC layer 9 and substrate 3 as a starting element. Instead of patterning the amorphous PAC layer followed by crystallization of the remaining portions of the layer, the amorphous PAC layer is imagewise addressed to produce crystallization selectively only in areas intended to be rendered electrically conductive. For example, by addressing the amorphous PAC layer with a laser areas directly impinged by the laser beam can be selectively crystallized to an electrically conductive form leaving the remaining amorphous areas unaffected. To define the conductive pattern generated it is only necessary to control the path of the laser beam.

Where a manufacturer chooses to sell an article consisting of a uniform amorphous PAC layer on a substrate, this approach to patterning can be more attractive than the uniform heating processes described above, since no oven is required to reach the temperatures typically required for crystallization. The fabricator choosing laser patterning may, in fact, require no other heating equipment. Thus, a very simple approach to forming a crystalline PAC pattern is available. It is, of course, recognized that additional heating for purposes of annealing or oxygen saturation can be undertaken, following lamp or laser crystallization, by heating in any desired manner.

Both lamp heating and laser scanning allow a broader range of substrates to be considered, particularly those which, though capable of withstanding ligand and solvent volatilization temperatures, are susceptible to degradation at crystallization temperatures. By choosing wavelengths in spectral regions to which the amorphous PAC layer is opaque or at least highly absorbing, direct radiant heating of the substrate can be reduced or eliminated. In this instance the bulk of the radiation is intercepted in the PAC layer before it reaches the substrate. The substrate can also be protected from direct radiant heating by choosing a substrate composition that is transparent to or minimally absorptive of the laser radiation. Since lasers emit coherent electromagnetic radiation of a single wavelength, high selectivity of absorption or transmission is much more readily achieved than when absorption or transmission must be averaged over a wavelength region of the spectrum.

In considering crystallization of a PAC layer by radiant energy to which the PAC layer is opaque or at least highly absorptive and employing a substrate which is substantially transparent to the radiant energy, whether supplied from a lamp or laser, advantages can be realized by supplying the radiant energy to the PAC layer through the substrate. Where a substantially transparent substrate is employed, little of the radiant energy is attenuated in traversing the substrate. The PAC layer absorbs the radiant energy adjacent its interface with the substrate. Thus, crystallization of the PAC layer can be initiated at this interface. By choosing a substrate of a crystal structure compatible with that of the crystals to be formed in the PAC layer, crystal growth in the PAC layer can occur epitaxially at the interface of the PAC layer and the substrate. It is desirable that the substrate present a surface for deposition of the PAC layer that at least approximates the spatial frequency of atoms favorable for epitaxy. For example, it is possible to slice a monocrystalline substrate so that it presents a planar surface having a frequency and spacing of oxygen atoms approximating that in the desired crystalline phase of the PAC layer.

To avoid coating imperfections the thickness of an amorphous PAC layer produced in a single process sequence is maintained at 1.5 $\mu$m or less, preferably 1.0 $\mu$m or less, a single process sequence being understood to constitute the steps described above for forming an amorphous PAC layer. By repeating the process sequence one or more times an amorphous PAC layer of any desired thickness can be built up.

While ideal substrates are those which remain chemically nonreactive during fabrication of the crystalline PAC layer, in practice when PAC crystallization temperatures are encountered by the substrate at least some interaction of the PAC layer occurs with all but the most stable of substrates. In some instances less than hoped for levels of electrical conductivity have been observed, believed to be attributable to interaction of the crystallized PAC layer with its substrate at their mutual interface. Unwanted reductions in $T_c$ and zero resistivity temperatures are believed to be unwanted manifestations of substrate interaction with the crystalline PAC layer. Such degradation has been observed for example, when employing alumina, silicon and quartz as the substrate material.

To minimize unwanted interaction of the PAC layer with the substrate it is specifically contemplated to interpose a barrier between the substrate and the PAC layer. It has been observed that each time the process sequence required for forming the amorphous PAC layer is repeated before proceeding on to the crystallization step of the process substrate (or barrier) interaction with the crystalline PAC layer is reduced, as reflected in its electrical conductivity properties, even where microscopic examination reveals individual grains or microcrystals extending from at or near the substrate to the top of the PAC layer. In this instance the portion of the crystalline PAC layer adjacent the substrate is acting as a barrier protecting the portion of the PAC layer remote from the substrate.

An alternative is to interpose between the substrate and the crystalline PAC layer a barrier of a different composition. The interposed barrier layer can itself take the form of a crystalline PAC layer, differing in the specific PAC composition chosen. In this instance the barrier layer can be viewed as a second crystalline PAC layer, which can, if desired, perform electrical conduction as well as acting as a barrier. In other instances the barrier can be viewed as an extension of the substrate. For example, a ceramic substrate coated with a thin refractory metal layer or a semiconductor substrate coated with an oxide or nitride, each of which are in turn overcoated with a crystalline PAC layer, can be viewed as an article having a composite substrate supporting a crystalline PAC layer or an article having a unitary substrate, a crystalline PAC layer, and an interposed barrier.

One specifically contemplated barrier arrangement is that disclosed by Agostinelli et al, cited above, where in the barrier layer interposed between the electrically conductive layer and the substrate contains magnesium, a Group 4 metal, or a platinum group (osmium, iridium, or platinum) metal, either in an elemental state or in the form of an oxide or silicide.

Another barrier layer arrangement which has been found particularly suitable for use with alumina (polycrystalline $Al_2O_3$ or sapphire), silica (fused quartz) and silicon substrates comprises a Group 4 metal (zirconium or hafnium) preferably in the form of an oxide.

One barrier layer arrangement specifically contemplated for silicon substrates is a barrier layer triad is interposed between a conductive layer and a silicon substrate. The barrier layer triad is comprised of a first triad layer located adjacent the silicon substrate consisting essentially of silica, a third triad layer removed from the silicon substrate consisting essentially of at least one Group 4 heavy metal (i.e., zirconium or hafnium) oxide, a second triad layer interposed between the first and third triad layers consisting essentially of a mixture of silica and at least one Group 4 metal oxide. This barrier layer protects the silicon substrate from contamination by the overlying conductive layer, particularly against copper contamination and protects the conductive layer from silicon contamination.

The first step of the process for forming such a barrier layer triad is to form on the silicon substrate a silica layer of at least 2000 Å in thickness. The silica layer is preferably at least 5000 Å in thickness. Any convenient thickness of the silica layer can be formed beyond the minimum thickness required. Silica layer formation on silicon substrates can be achieved by any convenient conventional means and forms no part of this invention. The silica layer is in most instances conveniently formed by oxidation of the silicon substrate surface to form a grown silicon oxide layer. Alternatively, the silica layer can be deposited.

Following formation of the silica layer at least one Group 4 heavy metal is deposited on the silica layer. The term "Group 4 heavy metal" is herein employed to indicate the elements zirconium and hafnium, which occupy Group 4 of the periodic table of elements, as adopted by the American Chemical Society. Group 4 elements are also referred to as Group IVA elements using the IUPAC notation system for the periodic table of elements. The Group 4 heavy metal or metals are deposited to form a layer which is from about 1000 to 5000 Å in thickness. At lower layer thicknesses barrier effectiveness can be degraded by inadequate Group 4 heavy metal while at greater layer thicknesses physical stresses in the layer are increased, which can lead to physical defects. The Group 4 heavy metal layer can be deposited on the silica layer by any convenient conventional technique compatible with achieving the desired layer thicknesses. Techniques such as vacuum vapor deposition, chemical vapor deposition, metal organic vapor deposition, and sputtering are adequate to achieved the desired layer arrangement.

The next step is to convert the silica and Group 4 heavy metal layers into a barrier layer triad. The first step toward achieving this objective is to heat the two initially formed layers in the absence of a reactive atmosphere to a temperature at which oxygen migration can occur. Heating is best accomplished in a vacuum or in an inert gas atmosphere, such as an argon atmosphere. The objective is to drive oxygen out of the silica layer into the Group 4 heavy metal layer. This forms Group 4 heavy metal oxides in the Group 4 heavy metal layer at a location remote from the underlying silica layer. At the same time the Group 4 heavy metal reacts with the silica layer at its interface to form Group 4 heavy metal silicides.

The result is to form a barrier layer triad comprised of a first triad layer consisting essentially of silica, a third triad layer consisting essentially of at least one Group 4 heavy metal oxide, and a second triad layer of the barrier triad interposed between the first and second triad layers consisting essentially of at least one Group 4 heavy metal silicide.

The time and temperature of heating required to produce the necessary oxygen migration are interrelated. Oxygen migration can be achieved at lower temperatures and longer heating times or at higher temperatures and shorter heating times. Generally temperatures of at least 700° C. are required to produce significant oxygen migration even when heating times are extended for 2 or more hours. On the other hand, it is not generally contemplated to employ heating temperatures in excess of about 1200° C. It is preferred to employ heating temperatures in the range of from about 750° C. to 1000° C., with optimum heating temperatures being in the range of from about 800° C. to 900° C. While adequate oxygen migration can occur by rapid thermal annealing at near maximum temperatures in time periods as low as about 1 minute, generally preferred heating times are from about 30 to 60 minutes.

Although the second triad layer as initially formed of Group 4 heavy metal silicide, this layer in the final conductive element may be totally or partially converted to a mixture of silica and Group 4 heavy metal oxide. This transformation results from subsequent heating in the presence of oxygen as may be employed in the formation of the conductive crystalline PAC layer to be formed over the barrier triad.

From the foregoing description it can be appreciated that the silicon substrate and the barrier layer triad together form the following sequence:

| |
|---|
| Third Triad Layer |
| Second Triad Layer |
| First Triad Layer |
| Silicon Substrate |

In completed conductive elements of this invention the first triad layer has a thickness of at least about 1000 Å. The maximum thickness of this layer is not critical and can range above 1 μm, if desired. The second and third barrier triad layers also each preferably have thicknesses of at least about 1000 Å, but typically each have thicknesses of 5000 Å or less.

Electrically conductive crystalline PAC layers can be formed on a wide variety of substrates. In general any conventional electrical conductor substrate capable of withstanding processing temperatures can be employed. For example, substrates in the form of metal wires, glass fibers, ceramic and glass plates, semiconductor wafers, and the like, all possess sufficient thermal stability to accept crystalline PAC layers applied by one or more of the procedures described above.

Any heavy pnictide mixed alkaline earth copper oxide composition known to be convertible to a crystalline phase can be employed in forming the coated articles of this invention. It has been observed that some combinations of substrates and heavy pnictide mixed alkaline earth copper oxides are particularly attractive in exhibiting higher $T_c$ levels and higher maximum temperatures at which superconductivity is in evidence.

One specifically preferred class of high $T_c$ articles according to this invention are those in which the crystalline PAC layer consists of greater than 30 percent and preferably greater than 70 by volume of a heavy pnictide mixed alkaline earth copper oxide which is in a crystalline phase that satisfies the formula:

$$P_2A_{3-x}Ca_xCu_2 \qquad (I)$$

where
P is bismuth optionally in combination with antimony,
A is strontium optionally in combination with barium, and
x is 0.5 to 1.5.

The Formula I crystalline phase is hereinafter for convenience referred to as the $P_2A_2A'C_2$ crystalline phase, where A and A' represent different alkaline earth metals and C represents copper. The heavy pnictides can be a combination of bismuth and antimony, with antimony accounting for only a minor amount (typically <10 mole percent) of the heavy pnictide. Optimally the heavy pnictide consists essentially of bismuth. The presence of antimony allows a reduction of the annealing temperature to obtain a crystalline conductive film from the mixed oxides. In order to achieve the benefit afforded by the presence of antimony, at least about 0.2 mole percent antimony with respect to the amount of bismuth should be present. However, when antimony reaches a level of about 10 mole percent with respect to the amount of bismuth or greater, the electrical properties of the resultant film degrades. The proffered range of antimony, when used, is from 0.5 to <5 mole percent of the heavy pnictides. The preferred Group 2 alkaline earths are calcium, strontium, and barium, with A preferably being strontium optionally in combination with a minor amount of barium. Optimally A consists essentially of strontium.

Preferred substrates are those which inert toward or at least minimally interactive with the PAC layer. It is generally preferred to select substrates from among materials which exhibit the same or a similar crystalline form, such as a perovskite crystalline form. Alkaline earth oxides constitute a particularly preferred class of substrates. They are in general relatively inert, refractory materials which exhibit limited interaction with the PAC layers during their formation. Strontium titanate, because it can be readily formed in a perovskite crystalline form, constitutes a specifically preferred alkaline earth oxide substrate material. Although some interaction between alkaline earth oxide substrate and a contiguous PAC layer is believed to occur when the article is heated to temperatures above about 900° C., interaction effects can be minimized by employing the interposed barrier formation techniques, described above. It is generally preferred to perform the amorphous PAC layer formation processing sequence to increase the thickness of the PAC layer and thereby assure minimum substrate interaction effects. Magnesia is another example of a specifically contemplated oxide substrate.

To facilitate formation of the most highly uniform crystalline PAC layers it is preferred that the substrate itself be monocrystalline. Monocrystalline strontium titanate and magnesia (periclase) are all readily available substrate materials. The foregoing substrates constitute preferred substrates for direct deposition of the PAC layer. When barrier layers are interposed between the substrate and the PAC layer, a much broader range of substrate materials can, of course, be employed, including silica, alumina, silicon, and various metals capable of withstanding the crystallization temperatures of the PAC layer, such as silver, gold, and any of the refractory metals. Oxidation of the metal substrate is generally unobjectionable.

The Group 4 metal oxide, zirconia, has been found to be a particularly suitable barrier layer for substrates such as silicon, silica and alumina in amorphous, polycrystalline or single crystal form. For example a barrier including a layer comprising zirconia has been successfully employed over sapphire, single crystal silicon, fused quartz and silicon oxide coated silicon substrates. One such layer is the barrier layer triad previously described. It is recognized that as a practical matter compositions containing zirconium also contain appreciable amounts of hafnium.

The formation of a particular crystalline orientation in the PAC layer can be facilitated by employing a substrate which presents a deposition surface of the same or a similar crystalline structure, such as a perovskite. A preferred orientation for increasing the current carrying capacity of the PAC layer is one in which the longest axis (hereinafter referred to as the "c axis") of the crystals is oriented substantially perpendicular to the substrate. Substrates of monocrystalline or polycrystalline magnesia and monocrystalline strontium titanate have been demonstrated to produce the desired c-axis orientation.

A preferred interface for the PAC layer is provided by noble metals, such as gold and silver. While noble metals can be employed as a unitary substrate onto which the PAC layer is directly coated, it is more economically advantageous to employ the noble metal as a surface layer on any convenient substrate capable of withstanding PAC processing temperatures, including any of those disclosed above. Silver is a particularly preferred noble metal to form a deposition surface for the PAC layer, since it has been observed to promote c-axis orientation of the PAC layer. Flexible tapes can be prepared in which a PAC layer is formed on a flexible silver coated substrate surface. An illustration of a particularly preferred article satisfying the requirements of the invention is a PAC layer coated on a silver layer on a zirconium substrate.

In the process of fabrication of this invention the formation of the desired PAC layer begins with the formation of a PAC precursor layer, such as layer 5 in article 1, shown in FIG. 1. By varying the relative amount of each of the heavy pnictide, alkaline earth, and copper precursor compounds in the precursor layer the composition of the final PAC layer can be controlled. However, it should be pointed out that it is not essential to form the precursor layer with the individual precursor compounds in the exact ratio found in a particular PAC crystal structure. For example, the preferred $P_2A_2A'C_2$ crystal structure, described above, can be formed even when there is a stoichiometric excess of one or more of the elements. Further, this can occur even when the ratios of the elements exactly correspond to that of another possible crystalline form, such as a $PAA'C_2$ or $PAA'C_3$. Any proportion of materials can be employed, so long as each of the required elements is present in an amount sufficient to provide at least 30 percent by volume of the desired crystalline $P_2A_2A'C_2$ phase. Generally closer matches of precursor to desired crystalline ratios of elements result in maximizing formation of the desired phase.

To form the precursor layer a solution of a film forming solvent, a heavy pnictide metal compound, at least two alkaline earth metal compounds, and a copper compound is prepared. Each of the heavy pnictide, alkaline earth, and copper compounds consists of metal ion and one or more volatilizable ligands. Most useful metal-ligand compounds (e.g., metalorganic compounds) thermally decompose to form metal oxides; however, some metal compounds, in particular some alkaline earth organic compounds, form metal carbonates on decomposition. Higher temperatures are then required to convert the carbonates to oxides. Consequently the term mixed metal oxide as used herein includes compositions which may comprise one or more carbonates. A ligand oxygen atom bonded directly to a metal is often retained with the metal in the PAC layer, although other ligand oxygen atoms are generally removed. At least 95 percent of the ligands and their component atoms other than oxygen are preferably outgassed at temperatures of less than 600° C. On the other hand, to avoid loss of materials before or during initial coating of the metal-ligand compounds, it is preferred that the ligands exhibit limited, if any, volatility at ambient temperatures. Metal ligand compounds having any significant volatility below their decomposition temperature are preferably avoided in the practice of this invention.

Metalorganic (including metallo-organic and organometallic) compounds, such as metal alkyls, alkoxides, β-diketone derivatives, and metal salts of organic acids—e.g., carboxylic acids, constitute preferred metal-ligand compounds for preparing PAC precursor coatings. The number of carbon atoms in the organic ligand can vary over a wide range, but is typically limited to less than 30 carbon atoms to avoid unnecessarily reducing the proportion of metal ions present. Carboxylate ligands are particularly advantageous in promoting metal-ligand solubility. While very simple organic ligands, such as oxalate and acetate ligands, can be employed in one or more metal-ligands compounds, depending upon the film forming solvent and other metal-ligand compound choices, it is generally preferred to choose organic ligands containing at least 4 carbon atoms. The reason for this is to avoid crystallization of the metal-ligand compound and to improve solubility. When heating is begun to remove the film forming solvent and ligands, the solvent usually readily evaporates at temperatures well below those required to remove the ligands. This results in leaving the metal-ligand compounds on the substrate surface. When the ligands have few carbon atoms or, in some instances, linear carbon atom chains, crystallization of the metal-ligand compounds occurs. In extreme cases crystallization is observed at room temperatures. This works against the molecular level uniformly of heavy pnictide, alkaline earth, and copper sought by solution coating. Choosing organic ligands exhibiting 4 or more carbon atoms, preferably at least 6 carbon atoms, and, preferably, ligands containing branched carbon atom chains, reduces molecular spatial symmetries sufficiently to avoid crystallization. Optimally organic ligands contain from about 6 to 20 carbon atoms.

Instead of increasing the molecular bulk or modifying the chain configuration of organic ligands to avoid any propensity toward metalorganic compound crystallization on solvent removal, another technique which can be employed is to incorporate in the film forming solvent a separate compound to act as a film promoting agent, such as a higher molecular weight branched chain organic compound. This can, for example, take the form of a branched chain hydrocarbon or substituted hydrocarbon, such as a terpene having from about 10 to 30 carbon atoms.

The film forming solvents can be chosen from a wide range of volatilizable liquids. The primary function of the solvent is to provide a liquid phase permitting molecular level intermixing of the metalorganic compounds chosen. The liquid is also chosen for its ability to cover the substrate uniformly. Thus, an optimum film forming solvent selection is in part determined by the substrate chosen. Generally more desirable film forming properties are observed with more viscous solvents and those which more readily wet the substrate alone, or with an incorporated wetting agent, such as a surfactant, present.

It is appreciated that a wide variety of ligands, film promoting agents, and film forming solvents are available and can be collectively present in a virtually limitless array of composition choices.

Exemplary preferred organic ligands for metal organic compounds include metal 2-ethylhexanoates, naphthenates, neodecanoates, butoxides, isopropoxides, rosinates (e.g., abietates), cyclohexanebutyrates, and acetylacetonates, where the metal can be any of the heavy pnictide, alkaline earth, or copper elements to be incorporated in the PAC layer. Exemplary preferred film forming agents include 2-ethylhexanoic acid, rosin (e.g., abietic acid), ethyl lactate, 2-ethoxyethyl acetate, and pinene. Exemplary preferred film forming solvents include toluene, 2-ethylhexanoic acid, n-butyl acetate, ethyl lactate, propanol, pinene, and mineral spirits.

As previously noted, the metal-ligand compounds are incorporated in the film forming solvent in the proportion desired in the final crystalline PAC layer. The heavy pnictide, alkaline earth, and copper can each be reacted with the same ligand forming compound or with different ligand forming compounds. The metal-ligand compounds can be incorporated in the film forming solvent in any convenient concentration up to their saturation limit at ambient temperature. Generally a concentration is chosen which provides the desired crystalline PAC layer thickness for the process sequence. Where the geometry of the substrate permits, uniformity and thickness of the metal-ligand coating can be controlled by spinning the substrate after coating around an axis normal to the surface of the substrate which has been coated. A significant advantage of spin coating is that the thickness of the coating at the conclusion of spinning is determined by the contact angle and viscosity of the coating composition and the rate and time of spinning, all of which can be precisely controlled. Differences in the amount of the coating composition applied to the substrate are not reflected in the thickness of the final coating. Centrifugal forces generated by spinning cause excess material to be rejected peripherally from the article.

Although processing temperatures employed in forming the amorphous PAC layers and in subsequently converting the amorphous layers to crystalline layers can very significantly, depending upon the specific PAC composition and crystal from under consideration, crystallization is in all instances achieved below the decomposition temperature of the PAC composition. It is a specific advantage of this invention that crystallization can be achieved at temperatures below 1000° C. PAC crystallization temperatures can range down to about 780° C. Optimum temperatures for crystallization vary somewhat, depending on the ratios of the PAC elements present. For example, for a $P_2A_2A'C_2$ ratio of elements, preferred crystallization temperatures are in the range of from 800° to 950° C., with optimum temperatures being in the range of from 850° to 920° C. With a $PAA'C_3$ ratio of elements, preferred crystallization temperatures are similar, but preferably about 810° C. With a $PAA'C_2$ ratio of elements, preferred crystallization temperatures are in the range of from 780° to 950° C., with optimum temperatures being in the range of from 800° to 880° C. Where crystal nucleation and growth are undertaken in separate steps, nucleation is preferably undertaken at a somewhat lower temperature than crystal growth.

Unlike RAC layers (e.g., those described by Mir et al), once the crystalline PAC layer is formed, its properties affected to a relatively small extent by their rate of cooling and the concentration of oxygen present during the cooling step. Thus, much greater flexibility if afforded in cooling and/or annealing following crystal formation. It appears that spontaneous cooling rates to ambient temperatures in air produce results generally comparable to those achieved with reduced cooling rates in an oxygen controlled atmosphere.

In some instances X-ray diffraction has revealed the presence of microcrystals in the amorphous PAC layer, although limited to minor amounts, typically less than about 5 percent, based on the total volume of the PAC layer. While crystallization of the metal-ligand compounds, which tends to separate the metals into different phases, is generally avoided, crystallization which occurs during or immediately following ligand volatilization is not objectionable, since metals absent their ligands are free to form mixed metal oxides.

From the foregoing description it is apparent that articles described above are comprised of a substrate and an electrically conductive layer located on the substrate. The electrically conductive layer is comprised of greater than 30 percent by volume of a crystalline heavy pnictide mixed alkaline earth copper oxide satisfying formula (II)

$$P_2A_{3-x}Ca_xCu_2O_y \qquad \text{(II)}$$

wherein

P is bismuth or bismuth in combination with antimony in a concentration of less than 10 mole percent based on bismuth;

A represents strontium or strontium in combination with a minor amount of barium;

x is from 0.5 to 1.5; and y is the amount of oxygen that results from heating an amorphous mixture of oxides of P, A, A' and C satisfying the ratio $$P_2A_{3-x}Ca_xCu_2 \qquad (I)$$

in the form of a coating having a thickness of 1 μm or less on the substrate to a temperature in the range of from 780° to 1000° C. in the presence of air.

EXAMPLES

Details of the preparation and performance of articles according to this invention are illustrated by the following examples. Although written in part in the present tense, the examples report laboratory investigations.

Precursors

The following individual metallo-organic precursors, prepared as described, were employed:

Bi-P1. Bismuth 2-ethylhexanoate 20.0 g Excess $Bi_2O_3$
25.0 g 2-Ethylhexanoic acid Mix the solid bismuth oxide with 2-ethylhexanoic acid and heat to approximately 120° C. Add a few drops of ammonium hydroxide (30% $NH_3/H_2O$) in order to speed up the reaction. After refluxing for 4 hours, filter, dry with sieves, and concentrate the liquid phase. Analysis showed 27.09% $Bi_2O_3$ residue (24.3% Bi) by weight.

Bi P2. Bismuth 2-ethylhexanoate 23.33 g Bismuth nitrate pentahydrate (Eastman)
21.71 g 2-Ethylhexanoic acid (Eastman)
9.10 g 30% $NH_3/H_2O$ Dissolve the bismuth nitrate in acidulated water (about 10 mL $HNO_3$ in 200 mL $H_2O$). This is to prevent hydrolysis of Bi $(NO_3)_3$. Combine the acid and ammonia slowly to make the amine soap and then combine slowly with the bismuth solution. Stir for 1 and ½ hours at 100° C. Separate in a separation funnel, dry with molecular sieves and then concentrate. Analysis of the thermally decomposed powder showed 5.07% $Bi_2O_3$ by weight giving a Bi concentration of 4.55%.

Ca-P1. Calcium 2-ethylhexanoate

Calcium carbonate was treated with excess of 2-ethylhexanoic acid and xylene as needed at 120° C. for 18 hours. The mixture was then filtered and dried with molecular sieves. This was followed by concentration and filtration of the solution. Analysis showed a residue of 4.58% CaO (3.27% Ca) by weight.

Ca-P2. Calcium napthenate

React calcium acetate with napthenic acids as follows:

Combine 1.5 g calcium acetate (available from Eastman Chemicals) with 6.0 g napthenic acids (available from Eastman Chemicals) and 1.0 g toluene. Heat at boiling point in an open vessel until the calcium acetate is reacted and no solids remain. During heating, 0.33 g of solvent is lost giving a solution with 4.17% by weight.

Sr-P1. Strontium cyclohexanebutyrate

This compound is available commercially in high quality from Eastman Chemicals. It is supplied with an assay indicating a strontium concentration of 19.4% by weight for the lot which was used.

Cu-P1. Copper 2-ethylhexanoate

The Cu precursor was prepared by reacting copper acetate with 2-ethylhexanoic acid as follows:

React copper acetate (available from Baker, as 1766-1, 31.8% Cu by weight) with 2-ethylhexanoic acid by mixing 2.0 g Cu Acetate into 8.0 g 2-ethylhexanoic acid, and heating to the boiling point for 5 minutes in an open vessel. Add back enough 2-ethylhexanoic acid to cancel the weight lost during reaction to return to 10.0 g total solution. At this point a stable Cu precursor solution having 6.36% Cu by weight is produced.

Sb-P1 Antimony 2-ethylhexanoate

To prepare antimony 2-ethylhexanoate, antimony chloride ($SbCl_3$) was reacted with an amine salt of 2-ethylhexanoic acid in an anhydrous solvent. A combination of di-ethyl ether, xylenes, and toluene was used as the solvent. The procedure employed was as follows:

To form an amine soap 29.9 g of 2-ethylhexanoic acid was combined with 30.9 g of triethanol amine. To this were added 15.8 g of antimony chloride and 20 mL of di-ethyl ester. The mixture was refluxed in an open vessel. After some evaporation of solvent, 50 mL of xylenes and 20 mL of toluene were added. Refluxing was continued until no further dissolution of solids occurred, the volume being maintained constant by toluene addition.

The liquid was separated by filtration and concentrated in a rotary evaporator. After a second filtration the solution of antimony 2-ethylhexanoate was determined by TGA/XRD to have an antimony concentration of 5.56 percent by weight.

BSCC-P1. $Bi_2Sr_2CaCu_2O_{8+x}$ Precursor

A precursor solution for $Bi_2Sr_2CaCu_2O_{8+x}$ was prepared as described below:

Mix 2.0 g of Bi-P1 with 1.43 g of Ca-P1 and 2.32 g of Cu-P1. These three solutions are miscible and form a stable solution. To this add 1.05 g Sr-P1 and heat at the boiling point to get all of the powder into solution. Some reaction has also likely occurred during this step (exchanges of carboxylate ligands). The result is a stable blue solution. To this solution add 0.5 g rosin (available from Eastman Chemicals as Rosin 2315) and heat gently to get all of the rosin in solution. Filter the solution to remove any particulate contaminants. The result is a stable solution having excellent rheological properties.

BSCC P2. $BiSrCaCu_3O_{6.5+x}$ Precursor

Using precursors similar to those described above, a precursor solution having the ratio Bi, Sr, Ca, Cu of 1:1:1:3 was prepared as follows:

Mix 1.0 g Bi precursor (24.3% Bi) with 1.43 g Ca precursor (3.27% Ca) and 3.48 g Cu precursor (6.36% Cu). The three individual solutions are miscible and form a stable solution. To the above add 0.525 g Sr cyclohexanebutyrate (19.4% Sr) and heat at the boiling point for 1 minute after which a stable solution of the four cation components is achieved. To this solution add 0.5 g rosin and heat gently to get the rosin into solution. After filtering, a stable solution having excellent rheological properties and having a Bi:Sr:Ca:Cu ratio of 1:1:1:3 is obtained.

BSCC-P3. $BiSrCaCu_2O_{5.5+x}$ Precursor

A precursor solution for $BiSrCaCu_2O_{5.5+x}$ was prepared as described below:

Combine 1.06 g of Ca-P2 precursor (4.17% Ca) with 5.0 g of Bi-P2 precursor (4.55% Bi) and 2.17 g Cu-P1 precursor (6.36% Cu). Add 0.492 g Sr-P1 precursor (19.4% Sr) and heat in an open vessel until all solids are in solution. Add 1.5 g rosin and heat at boiling point for 30 seconds. Although this solution is usable, it has a low metal loading and its aerial stability is not high.

SSCC-P1. $Sb_2Sr_2CaCu_2O_{8+x}$ Precursor

A solution was prepared by combining 3.0 g of Sb-P1 with 0.800 g of Ca-P1 and 1.30 g Cu-P1. To this was added 0.589 g Sr-P1. The mixture was heated at about 150° C. until no solid remained. A stable sapphire blue solution having the ratio of Sb:Sr:Ca:Cu of 2:2:1:2 resulted.

EXAMPLE 1

$Bi_2Sr_2CaCu_2O_{8+x}$ thin film on magnesium oxide

Precursor BSCC-P1 was spin coated onto a 1.27 cm by 1.27 cm by 0.025 cm single crystal MgO substrate with (100) face orientation. Spin speed was 5000 rpm and spin time was 20 seconds.

The coated substrate was thermally treated on a hot stage in air. The temperature was ramped from room temperature to 550° C. in 10 minutes. After 5 minutes at 550° C. the sample was removed. This process was repeated two more times to give three layers of the material.

At this point the film had a glossy appearance with a metallic luster and is essentially amorphous. In order to produce the superconducting $Bi_2Sr_2CaCu_2O_8+x$ superconducting crystalline phase, the film was further heat treated. The film was loaded into an 865° C. box furnace, in air. After 5 minutes the film was removed. The film was now black and quite conducting with a four point sheet resistance at room temperature of 35 ohms/square. It was polycrystalline with a grain size of about 1 μm. It was also highly oriented with its c-axis normal to the substrate as evidenced by x-ray diffraction spectrometry.

Indium contacts were applied at room temperature. A four-point ac resistance measurement was employed. The film showed excellent superconducting characteristics. There was a metallic, linear resistance vs. temperature relationship at higher temperatures with a transition to the superconducting state ($T_c$) beginning in the vicinity of 105° K. The superconducting zero resistance ($T_o$) state was achieved at about 75° K.

EXAMPLE 2

Thin Film of $Bi_2Sr_2CaCu_2O_{8+x}$ on $SrTiO_3$

Using the same percursor and coating procedure as in Example 1, a thin film of $Bi_2Sr_2CaCu_2O_{8+x}$ was prepared on (100) oriented single crystal strontium titanate. However, only two layers were used for this film. The same high temperature treatment as described in Example 1B was used for Example 2. The 865° C. treated film was again black and conducting with a room temperature 4-point resistivity of 40 ohms/square. The film was about 1.5 μm in thickness. Its x-ray diffraction pattern showed again a highly oriented thin film of $Bi_2Sr_2CaCu_2O_{8+x}$ on a single crystal $SrTiO_3$ substrate with the c-axis of the thin film oriented normal to the substrate. Low temperature resistance measurement (FIG. 4) again revealed excellent electrical characteristics with the metallic to superconducting transition ($T_c$) beginning in the vicinity of 110° K. and superconducting zero resistance ($T_o$) state achieved at about 78° K.

EXAMPLE 3

Thin film with composition $BiSrCaCu_3O_{6.5+x}$ on MgO

Using precursor solution BSCC-P2 a thin film was prepared as follows:

Spin the precursor solution described above onto a 1.27 cm by 1.27 cm by 0.025 cm single crystal MgO substrate (100) face, at 4000 rpm for 20 seconds. Thermally process the film on a hot stage in air by ramping the temperature from room temperature to 550° C. in about 10 minutes. Hold at 550° C. for 5 minutes. Remove from the hot stage. Repeat the above procedure for four subsequent layers giving a total of 5 layers. Next, form the superconducting phase by placing the film in air in an 825° C. box furnace. Remove the sample after 5 minutes. The film is black and quite conducting with a four point resistivity of 70 ohms/square. It is approximately 1 μm in thickness. Low temperature resistivity behavior again reveals a metallic to superconducting transition ($T_c$) beginning above 100° K. with superconducting zero resistance ($T_o$) being achieved at about 77° K.

EXAMPLE 4

$BiSrCaCu_3O_{6.5+x}$ deposited on MgO higher temperature processing

A sample, identical in preparation up to the 550° C. treatments as Example 3 is made to undergo a high temperature processing step. The 550° C. treated film is loaded into an 865° C. box furnace (in air) and held there for 5 minutes. The sample is removed quickly. It is black, moreover low power optical microcopy suggests microscopy and energy dispersive x-ray spectrometry (EDS) reveal that the major connected phase in the sample has the stoichiometry $Bi_2Sr_2CaCu_2O_{8+x}$. Low temperature resistivity measurements again show a superconducting transition ($T_c$) and superconducting zero resistance at temperatures below 73° K.

EXAMPLE 5

Thin film of $Bi_2Sr_2CaCu_2O_{8+x}$ on polycrystalline MgO

The procedure of Example 1 is repeated exactly, except that polycrystalline MgO is substituted for the single crystal material. The finished film is highly oriented with its c-axis normal to the substrate as shown by X-ray diffraction spectrometry. It is black and conducting at room temperature.

EXAMPLE 6

Thin film having composition $BiSrCaCu_2O_{5.5+x}$ on MgO.

Using precursor solution BSCC-P3 a thin film was prepared as follows:

Spin-coat the above precursor for $BaSrCaCu_2O_{5.5+x}$ onto a 1.27 cm by 1.27 cm by 0.025 cm single crystal MgO (100) substrate at 2000 rpm for 30 seconds. Thermally decompose the layer by ramping the sample from room temperature to 550° C. in 10 minutes on a hot stage. Hold sample at 550° C. for 5 minutes and remove. Repeat this procedure for a total of 8 layers. Next, perform the high temperature treatment to achieve the superconducting crystalline phase by loading the 8 layer film into an 825° C. box furnace. Remove quickly after 8.5 minutes. The resulting film is black with a room temperature resistivity of 92 ohms/square. Low temperature resistivity measurements show a metallic to superconducting transition ($T_c$) above 100° K. and a superconducting zero resistance starting just below 30° K.

It has been found that growth of the novel superconductor films, e.g., films of $Bi_2Sr_2CaCu_2O_{8+x}$ on substrates such as alumina, silicon and quartz generally require a diffusion barrier layer between the substrate and the superconducting film in order to maintain the electrical properties of the film. Without the barrier, ion migration from the substrate surface tends to degrade the electrical properties of the film. The following examples set forth laboratory experiments demonstrating this observation.

EXAMPLE 7

A thin film of the $Bi_2Sr_2CaCu_2O_{8+x}$ was deposited on a single crystal Si substrate by spin coating of the precursor as set forth in Example 1. The sample was heated to 550° C. to form a film of the mixed metal oxide. The mixed metal oxide was then heated in air at a temperature above 800° C. in an attempt to form the conductive crystalline orthorhombic $Bi_2Sr_2CaCu_2O_{8+x}$ structure. However Rutherford backscattering measurements indicated strong interactions between the surface oxide film and the Si substrate with no orthorhombic phase formation. Further, the sheet resistance of the film was immeasurably high.

EXAMPLES 8 AND 9

The procedure set forth in Example 7 was repeated using fused quartz (Example 8) and sapphire (Example 9) as substrates. In both instances Rutherford backscattering revealed complete obliteration of the film after the high temperature process due to chemical reaction with the substrate. The samples were again found to be non conducting.

EXAMPLE 10

A thin film of zirconia ($ZrO_2$) was produced on a polished fuzed quartz substrate. The film was prepared by the thermal decomposition of a precursor solution consisting of toluene as a solvent and 50 percent by weight, based on total weight, of zirconium n-propoxide tri-neodecanoate. The zirconium n-propoxide tri-neodecanoate was prepared by mixing stoichiometric amounts of zirconium n-propoxide and neodecanoic acid at room temperature.

The above precursor was spin coated onto the fused quartz substrate at 5000 rpm over a period of 20 seconds. The film was then heated to 550° C. on a hot plate. Thereafter, the film was further heated to 850° C. for five minutes. This coating technique was performed a total of two times, resulting in a final zirconia barrier layer thickness of 0.3 microns.

Thereafter a two layer superconducting $Bi_2Sr_2CaCu_2O_{8+x}$ oxide film was prepared on the $ZrO_2$ layer using sequential spin coating of the precursor and processing as described in Example 1. The high temperature anneal employed was 870° C. A number of cracks were observed to have developed on the surface of the film. The room temperature resistivity of the film was about one order of magnitude higher than the value obtained from the corresponding film on single crystal MgO as the substrate as per Example 1.

EXAMPLE 11

The same process as described in Example 10 was repeated except that bare Si and Si covered with $SiO_2$ were employed as substrate materials. The resulting $Bi_2Sr_2CaCu_2O_{8+x}$ films on the $ZrO_2$ barrier layer were conducting, having a sheet resistance of 200–400 ohms/sq. at room temperature. X-ray diffraction of the films revealed the formation of the orthorhombic structure. Resistance v. temperature measurements from room temperature down to liquid helium temperatures were performed using a four point probe technique. The measurements indicated a drop in resistance around 95° K. However, the transition was broad and the zero resistance state was not reached at temperatures as low as 15° K.

EXAMPLE 12

The same process as described in Example 10 was repeated except that a polycrystalline $Al_2O_3$ substrate having 4 atom percent Si was employed. The sheet resistance of the $Bi_2Sr_2CaCu_2O_{8+x}$ film on $ZrO_2$ was about 80 ohms/sq. at room temperature and decreased linearly with temperature. At 95° K. the resistance started to drop abruptly with decreasing temperature. However, the transition to superconductivity was broad and possessed a tail at low temperature. The zero resistance state was observed below 22° K.

EXAMPLE 13

This example involves the same process as described in Example 10, except that a sapphire substrate was used. The resulting oxide film showed a smooth surface and possessed a room temperature resistivity comparable to that of the film on MgO. SEM measurements revealed a well defined polycrystalline structure and 4 point probe measurements showed a transition to superconductivity with its onset temperature 100° K. and transition width (10–90%) of 15° K.

EXAMPLE 14

This example describes the preparation of a barrier triad-layer over a silicon substrate prior to formation of the conductive film.

An $SiO_2$ layer 0.5 μm thick was formed on a single crystal Si substrate by a thermal oxidation of the substrate surface. Thin Zr films 0.15 μm thick were then vacuum evaporated on the $SiO_2$ and subsequently annealed in vacuum at 850° C. for 5 minutes to accommodate thermal stress, inhibit grain boundary diffusion and to produce a barrier layer triad having the configuration Si substrate/$SiO_2$/ZrSi/$ZrO_2$. Two layer superconducting oxide films were then prepared on the barrier structure as described in Example 11. Rutherford backscattering did not reveal significant interactions between the surface oxide film and the underlying substrate. SEM showed a plate-like structure with the average diameter of these thin plates being several microns. The conductive PAC oxide film possessed a sheet resistance of about 100 ohms/sq. at room temperature and showed a relatively sharp transition to superconductivity with a midpoint transition temperature near 90° K. The zero resistivity state was reached at 70° K.

EXAMPLE 15

This example involves the same process as described in Example 14, except that Zr was deposited on a fused quartz substrate to produce a barrier triad. Mechanical deformation of the film, such as cracking and peeling, was not observed. Transition onset to the superconducting state began at 95° K. and was about 90% complete at 80° K. The zero resistance temperature was about 70° K.

As can be seen from examples 7–15, highly conducting and superconducting films of the bismuth alkali metal oxides can be achieved on certain substrates having suitable barrier layers where, without such barrier layers, the resulting films are of low conductivity, at best, on those substrates.

EXAMPLE 16

This example illustrates the effect of incorporating 2 mole percent antimony based on bismuth in the heavy pnictide mixed alkaline earth copper oxide composition. To accomplish this BACC-P1 was combined with SSCC-P1 to give a solution containing 2 mole percent antimony based on bismuth.

The combined solution was spin coated onto a single crystal MgO (100) substrate at 5000 rpm for 20 seconds. The metal organic coated film was converted to an inorganic film by ramping the temperature of the sample on a hot stage in air from room temperature to 550° C. in 10 minutes. The layer formation process was then repeated on top of the previously formed layer.

The mixed metal oxide film was next converted to a crystalline film by thermal processing in a box furnace in air at 855° C. for 5 minutes. The sample was cooled rapidly by removal to ambient air.

The crystalline film produced exhibited a mean grain size in the range of from 3 to 4 $\mu$m. This was significantly greater than the corresponding mean grain diameter (approx. 1 $\mu$m) of a crystalline film which lacked antimony prepared similarly to that of Example 1, except for using a temperature of 855° C. for crystallization.

Resistivity was a function of temperature was similar to the crystalline film of Example 1.

EXAMPLE 17

This example illustrates the effect of incorporating 0.5 mole percent antimony based on bismuth in the heavy pnictide mixed alkaline earth copper oxide composition. To accomplish this the BSCC-P1 was combined with SSCC-P1 to give a solution containing 0.5 mole percent antimony based on bismuth.

The combined solution was spin coated onto a single crystal MgO (100) substrate at 5000 rpm for 20 seconds. The metal organic coated film was converted to an inorganic film by ramping the temperature of the sample on a hot stage in air from room temperature to 550° C. in 10 minutes. The layer formation process was then repeated on top of the previously formed layer.

The mixed metal oxide film was next converted to a crystalline film by thermal processing in a box furnace in air at 855° C. for 5 minutes. The sample was cooled rapidly by removal to ambient air.

The crystalline film produced exhibited a mean grain size in the range of from 1.5 to 2 $\mu$m. This was significantly greater than the corresponding mean grain diameter (approx. 1 $\mu$m) of a crystalline film which lacked antimony prepared similarly to that of Example 1, except for using a temperature of 855° C. for crystallization.

EXAMPLE 18

This example illustrates the effect of incorporating 10 mole percent antimony based on bismuth in the heavy pnictide mixed alkaline earth copper oxide composition. To accomplish this BSCC-P1 was combined with SSCC-P1 to give a solution containing 10 mole percent antimony based on bismuth.

The combined solution was spin coated onto a single crystal MgO (100) substrate at 5000 rpm for 20 seconds. The metal organic coated film was converted to an inorganic film by ramping the temperature of the sample on a hot stage in air from room temperature to 550° C. in 10 minutes. The layer formation process was then twice repeated on top of the previously formed layer.

The mixed metal oxide film was next converted to a crystalline film by thermal processing in a box furnace in air at 855° C. for 5 minutes. The sample was cooled rapidly by removal to ambient air.

The crystalline film produced behaved as an electrical insulator. Microscopic examination of the film revealed a very different crystal structure from that observed in Examples 16 and 17. The crystals were smaller and of a dissimilar grain morphology.

The invention has been described in detail with particular reference to preferred embodiments thereof, but it will be understood that variations and modifications can be effected within the spirit and scope of the invention.

What is claimed is:

1. An article comprised of an alkaline earth oxide substrate and an electrically conductive layer located on the substrate characterized in that the electrically conductive layer is comprised of a crystalline heavy pnictide mixed alkaline earth copper oxide satisfying the formula (II)

$$P_2A_{3-x}Ca_xCu_2O_y \quad (II)$$

wherein

P is bismuth or bismuth in combination with antimony in a concentration of less than 10 mole percent based on bismuth;

A represents strontium or strontium in combination with a minor amount of barium;

x is from 0.5 to 1.5; and y is the amount of oxygen that results from heating an amorphous mixture of oxides of P, A, Ca and Cu satisfying the ratio $$P_2A_{3-x}Ca_xCu_2 \quad (I)$$

in the form of a coating having a thickness of 1 $\mu$m or less on the substrate to a temperature in the range of from 780° to 1000° C. in the presence of air.

2. An article comprised of substrate and an electrically conductive layer located on the substrate characterized in that the substrate exhibits a perovskite crystal structure and the electrically conductive layer is comprised of a crystalline heavy pnictide mixed alkaline earth copper oxide satisfying the formula (II)

$$P_2A_{3-x}Ca_xCu_2O_y \quad (II)$$

wherein

P is bismuth or bismuth in combination with antimony in a concentration of less than 10 mole percent based on bismuth;

A represents strontium or strontium in combination with a minor amount of barium;

x is from 0.5 to 1.5; and y is the amount of oxygen that results from heating an amorphous mixture of oxides of P, A, Ca and Cu satisfying the ratio $$P_2A_{3-x}Ca_xCu_2 \quad (I)$$

in the form of a coating having a thickness of 1 μm or less on the substrate to a temperature in the range of from 780° to 1000° C. in the presence of air.

3. An article comprised of a substrate, a barrier and an electrically conductive layer located on the barrier characterized in that the substrate is chosen from the group consisting of alumina, silica and silicon, the barrier is comprised of hafnia or zirconia and the electrically conductive layer is comprised of a crystalline heavy pnictide mixed alkaline earth copper oxide satisfying the formula (II)

$$P_2A_{3-x}Ca_xCu_2O_y \quad (II)$$

wherein

P is bismuth or bismuth in combination with antimony in a concentration of less than 10 mole percent based on bismuth;

A represents strontium or strontium in combination with a minor amount of barium;

x is from 0.5 to 1.5; and y is the amount of oxygen that results from heating an amorphous mixture of oxides of P, A, Ca and Cu satisfying the ratio $$P_2A_{3-x}Ca_xCu_2 \quad (I)$$

in the form of a coating having a thickness of 1 μm or less on the substrate to a temperature in the range of from 780° to 1000° C. in the presence of air.

4. An article comprised of a substrate and an electrically conductive layer located on the substrate characterized in that the substrate is silver and the electrically conductive layer is comprised of a crystalline heavy pnictide mixed alkaline earth copper oxide satisfying the formula (II)

$$P_2A_{3-x}Ca_xCu_2O_y \quad (II)$$

wherein

P is bismuth or bismuth in combination with antimony in a concentration of less than 10 mole percent based on bismuth;

A represent strontium or strontium in combination with a minor amount of barium;

x is from 0.5 to 1.5; and y is the amount of oxygen that results from heating an amorphous mixture of oxides of P, A, Ca and Cu satisfying the ratio $$P_2A_{3-x}Ca_xCu_2 \quad (I)$$

in the form of a coating having a thickness of 1 μm or less on the substrate to a temperature in the range of from 780° to 1000° C. in the presence of air.

5. An article comprised of a substrate and a layer of an amorphous metal oxide located on the substrate characterized in that the substrate exhibits a perovskite crystal structure and the amorphous metal oxide is a heavy pnictide mixed alkaline earth copper oxide exhibiting (a) a ratio of metal (I)

$$P_2A_{3-x}Ca_xCu_2 \quad (I)$$

wherein

P is bismuth or bismuth in combination with antimony in a concentration of less than 10 mole percent based on bismuth;

A represents strontium or strontium in combination with a minor amount of barium; and x is from 0.5 to 1.5; and (b) an oxygen content which results from (i) forming a solution comprised of a volatilizable film-forming solvent and metal-carboxylate ligand compounds of the metals and in the proportions of (I), (ii) coating the solution on the substrate, and (iii) removing the solvent and ligands from the substrate by heating in the presence of air.

6. An article comprised of a substrate, a barrier layer and a layer of an amorphous metal oxide located on the barrier characterized in that the barrier layer is comprised of hafnia or zirconia, the substrate is chosen from the group consisting of alumina, silica and silicon, and the amorphous metal oxide is a heavy pnictide mixed alkaline earth copper oxide exhibiting (a) a ratio of metal (I)

$$P_2A_{3-x}Ca_xCu_2 \quad (I)$$

wherein

P is bismuth or bismuth in combination with antimony in a concentration of less than 10 mole percent based on bismuth;

A represents strontium or strontium in combination with a minor amount of barium; and x is from 0.5 to 1.5; and (b) an oxygen content which results from (i) forming a solution comprised of a volatilizable film-forming solvent and metal-carboxylate ligand compounds of the metals and in the proportions of (I), (ii) coating the solution on the substrate, and (iii) removing the solvent and ligands from the substrate by heating in the presence of air.

7. An article comprised of a substrate and a layer of an amorphous metal oxide located on the substrate characterized in that the substrate is silver and the amorphous metal oxide is a heavy pnictide mixed alkaline earth copper oxide exhibiting (a) a ratio of metal (I)

$$P_2A_{3-x}Ca_xCu_2 \quad (I)$$

wherein

P is bismuth or bismuth in combination with antimony in a concentration of less than 10 mole percent based on bismuth;

A represents strontium or strontium in combination with a minor amount of barium; and x is from 0.5 to 1.5; and (b) an oxygen content which results from (i) forming a solution comprised of a volatilizable film-forming solvent and metal-carboxylate ligand compounds of the metals and in the proportions of (I), (ii) coating the solution on the substrate, and (iii) removing the solvent and ligands from the substrate by heating in the presence of air.

8. An article according to claim 1, 2, 3 or 4 further characterized in that the conductive layer is restricted to a portion of the substrate thereby defining a conduction path on the substrate.

9. An article according to claim 4 further characterized in that both the substrate and the conductive layer are flexible.

10. An article according to claim 1, 2, 3, or 4 further characterized in that the conductive layer has a thickness of 5 $\mu$m or less.

11. An article according to claim 1 further characterized in that the substrate is magnesia.

12. An article according to claim 2 further characterized in that the substrate is strontium titanate.

13. An article according to claim 1, 2 or 3 further characterized in the substrate is monocrystalline.

14. An article according to claim 1, 2, 3 or 4 further characterized in that the crystalline heavy pnictide mixed alkaline earth copper oxide is oriented with its longest crystal axis substantially perpendicular to the substrate.

15. An electrically conductive article according to claim 1, 2, 3 or 4 further characterized in that the conductive layer exhibits a superconducting transition temperature of greater than 90° K.

16. An article according to claim 15 further characterized in that the conductive layer exhibits superconductivity at a temperature greater than 77° K.

17. An article according to claim 1, 2, 3 or 4 further characterized in that the conductive layer consists of greater than 30 percent by volume of a crystalline oxide conductive phase satisfying the metal ratio $$P_2A_{3-x}Ca_xCu_2$$

where
P is bismuth or bismuth in combination with antimony in a concentration of less than 10 mole percent based upon bismuth,
A consists essentially of strontium or strontium in combination with barium, and
x is 0.5 to 1.5.

18. An article according to claim 16 further characterized in that said conductive layer consists of greater than 70 percent by volume of said crystalline oxide conductive phase.

19. An article according to claim 16 further characterized in that said conductive layer consists of greater than 90 percent by volume of said crystalline oxide conductive phase.

20. An article according to claim 16 further characterized in that P consists essentially of bismuth.

21. An article comprised of a substrate and a layer of an amorphous metal oxide located on the substrate characterized in that the substrate is an alkaline earth oxide and the amorphous metal oxide is a heavy pnictide mixed alkaline earth copper oxide exhibiting
(a) a ratio of metals (I)

$$P_2A_{3-x}Ca_xCu_2 \tag{I}$$

wherein
P is bismuth or bismuth in combination with antimony in a concentration of less than 10 mole percent based on bismuth;
A represents strontium or strontium in combination with a minor amount of barium; and
x is from 0.5 to 1.5; and
(b) an oxygen content which results from (i) forming a solution comprised of a volatilizable film-forming solvent and metal-carboxylate ligand compounds of the metals and in the proportions of (I), (ii) coating the solution on the substrate, and (iii) removing the solvent and ligands from the substrate by heating in the presence of air.

22. An article according to claim 21, 5, 6 or 7 further characterized in that the substrate presents a planar surface and the amorphous metal oxide forms a planar layer on the planar substrate surface.

23. An article according to claim 1, 2, 3, 4, 21, 5, 6 or 7 further characterized in that the electrically conductive layer includes from 0.2 to <10 mole percent antimony with respect to the bismuth.

24. An article according to claim 23 further characterized in that the electrically conductive layer includes from 0.5 to <5 mole percent antimony with respect to bismuth.

25. An article according to claim 3 or 6 further characterized in that the barrier layer comprises zirconia.

26. An article according to claim 25 further characterized in that said substrate is selected from the group consisting of fused quartz, single crystal silicon, single crystal silicon having an $SiO_2$ film over the surface thereof, sapphire and polycrystalline alumina.

27. An article according to claim 3 or 6 further characterized in that said substrate is silicon and said barrier layer is a barrier layer triad comprised of a first triad layer located adjacent the silicon substrate consisting essentially of silica, a third triad layer remove from the silicon substrate consisting essentially of one Group 4 heavy metal oxide, and a second triad layer interposed between the first and third triad layers comprising a mixture of silica and at least one Group 4 heavy metal oxide.

28. An article according to claim 27 further characterized in that the second and third triad layers each have a thickness in the range of from 1000 to 5000 Å.

* * * * *